(12) United States Patent
Moon et al.

(10) Patent No.: US 11,637,155 B2
(45) Date of Patent: Apr. 25, 2023

(54) DISPLAY DEVICE FOR CHANGING A SENSING MODE AND OPERATING METHOD THEREOF

(71) Applicant: Samsung Display Co., Ltd., Yongin-si (KR)

(72) Inventors: Gyeong-Ub Moon, Suwon-si (KR); Yun-Ho Kim, Hwaseong-si (KR); Chui Kim, Hwaseong-si (KR); Jaeuk Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/341,139

(22) Filed: Jun. 7, 2021

(65) Prior Publication Data
US 2022/0181394 A1 Jun. 9, 2022

(30) Foreign Application Priority Data
Dec. 7, 2020 (KR) .......................... 10-2020-0169545

(51) Int. Cl.
*H01L 27/32* (2006.01)
*G06F 3/041* (2006.01)
*G06F 3/044* (2006.01)

(52) U.S. Cl.
CPC .......... *H01L 27/323* (2013.01); *G06F 3/0412* (2013.01); *G06F 3/0445* (2019.05); *G06F 3/04164* (2019.05); *G06F 3/04184* (2019.05); *H01L 27/326* (2013.01); *H01L 27/3276* (2013.01)

(58) Field of Classification Search
CPC .............. G06F 3/0412; G06F 3/04164; G06F 3/04184; G06F 3/0445; H01L 27/323; H01L 27/326; H01L 27/3276
See application file for complete search history.

(56) References Cited

U.S. PATENT DOCUMENTS

| 10,203,782 | B2 | 2/2019 | Jung et al. | |
|---|---|---|---|---|
| 2014/0125628 | A1* | 5/2014 | Yoshida | G06F 3/0445 |
| | | | | 345/174 |
| 2018/0024654 | A1* | 1/2018 | Koike | G09G 3/20 |
| | | | | 345/174 |
| 2018/0181241 | A1* | 6/2018 | Jung | G06F 3/0442 |

FOREIGN PATENT DOCUMENTS

| KR | 10-2016-0053301 A | 5/2016 |
|---|---|---|
| KR | 10-2016-0053302 A | 5/2016 |
| KR | 10-2017-0015777 A | 2/2017 |
| KR | 10-1808339 B1 | 12/2017 |

* cited by examiner

*Primary Examiner* — Afroza Chowdhury
(74) *Attorney, Agent, or Firm* — Lewis Roca Rothgerber Christie LLP

(57) ABSTRACT

A display device includes: a display panel; an input sensor on the display panel; a panel driving circuit to drive the display panel, and to output a synchronization signal; and a sensor controller to control the input sensor. The sensor controller determines a sensing mode in response to the synchronization signal, and changes the sensing mode to a second sensing mode when the synchronization signal is activated in a first sensing mode.

20 Claims, 18 Drawing Sheets

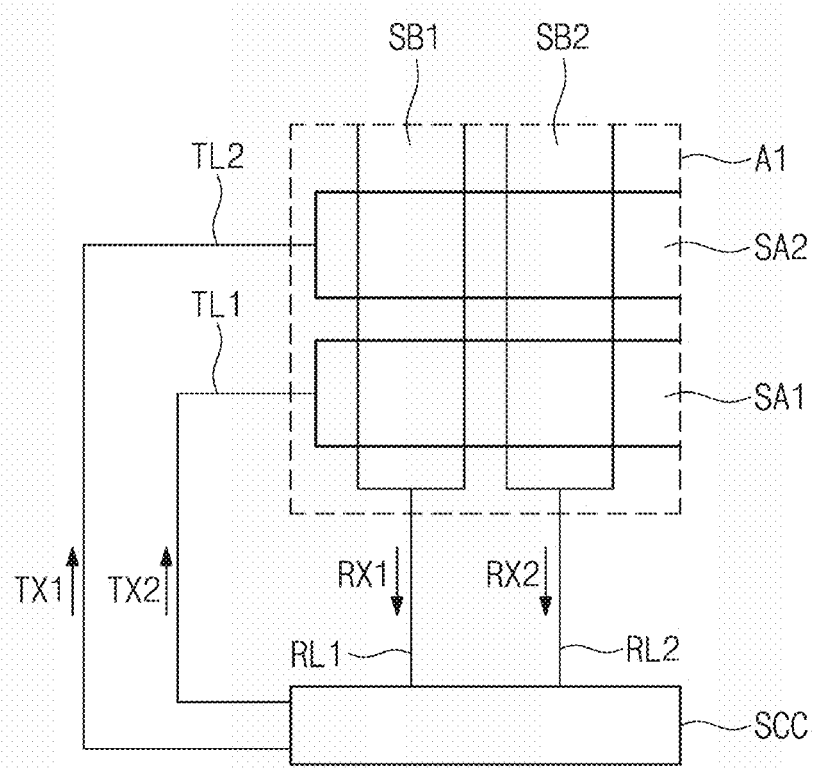

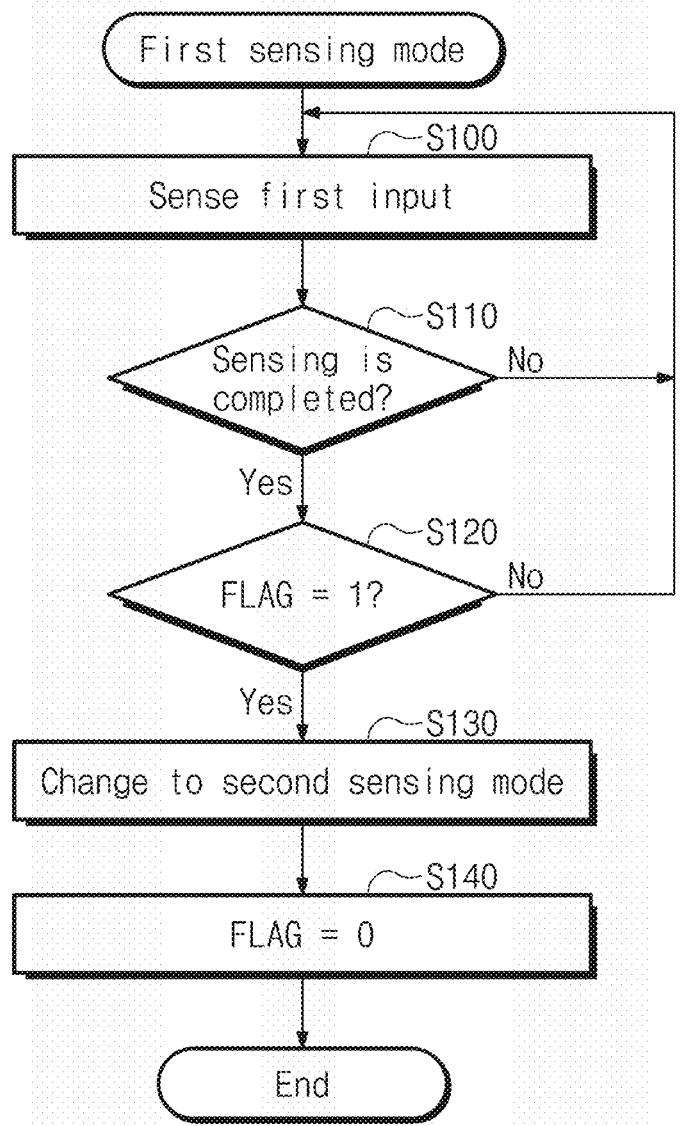

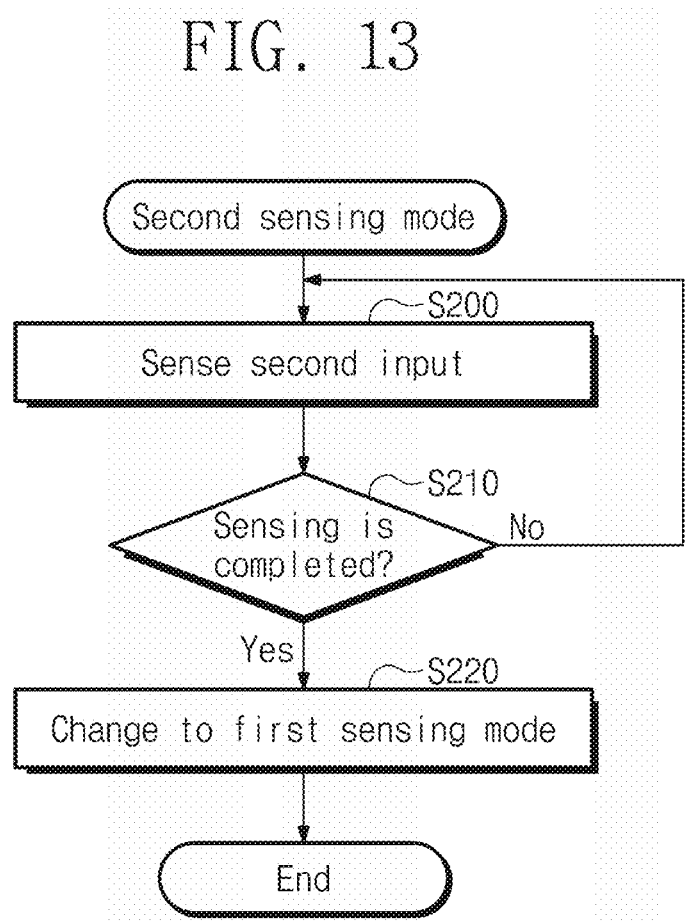

DISPLAY DEVICE FOR CHANGING A SENSING MODE AND OPERATING METHOD THEREOF

CROSS-REFERENCE TO RELATED APPLICATIONS

This application claims priority to and the benefit of Korean Patent Application No. 10-2020-0169545, filed on Dec. 7, 2020, in the Korean Intellectual Property Office, the entire disclosure of which is incorporated by reference herein.

BACKGROUND

1. Field

Aspects of embodiments of the present disclosure relate to a display device.

2. Description of the Related Art

Multimedia electronic devices, for example, such as a TV, a mobile phone, a tablet personal computer (PC), a computer, a navigation device, a game console, and the like, include display devices that display an image. In addition to a general input method such as a button, a keyboard, a mouse, or the like, an electronic device may include a display device capable of providing a touch-based input method that allows a user to enter information or commands easily and intuitively.

Further, a personal electronic device such as a mobile phone may sense not only a touch but also an input of an electronic pen.

The above information disclosed in this Background section is for enhancement of understanding of the background of the present disclosure, and therefore, it may contain information that does not constitute prior art.

SUMMARY

One or more embodiments of the present disclosure are directed to a display device having improved sensitivity while sensing an input from various suitable input devices, and an operating method thereof.

According to one or more embodiments of the present disclosure, a display device includes: a display panel; an input sensor on the display panel; a panel driving circuit configured to drive the display panel, and to output a synchronization signal; and a sensor controller configured to control the input sensor. The sensor controller is configured to determine a sensing mode in response to the synchronization signal, and to change the sensing mode to a second sensing mode when the synchronization signal is activated in a first sensing mode.

In an embodiment, the first sensing mode may include a plurality of first sensing periods.

In an embodiment, when the synchronization signal is activated during a k-th first sensing period from among the plurality of first sensing periods, where k is a natural number, the sensor controller may be configured to complete the k-th first sensing period, and to change the sensing mode to the second sensing mode.

In an embodiment, the second sensing mode may include a plurality of second sensing periods.

In an embodiment, each of the plurality of first sensing periods may be longer in time than each of the plurality of second sensing periods.

In an embodiment, the synchronization signal may be a signal activated at a point in time when each of a plurality of image frames is started.

In an embodiment, each of the plurality of first sensing periods may be shorter in time than each of the plurality of image frames.

In an embodiment, when the synchronization signal is activated, the sensor controller may be configured to set a flag bit to a first value.

In an embodiment, when the flag bit is the first value during a k-th first sensing period from among the plurality of first sensing periods, where k is a natural number, the sensor controller may be configured to complete the k-th first sensing period, and to change the sensing mode to the second sensing mode.

In an embodiment, the display panel may include: a plurality of pixels connected to a plurality of scan lines and a plurality of data lines; and a scan driving circuit connected to the plurality of scan lines, and the scan driving circuit may be configured to provide scan signals to the plurality of scan lines, respectively, in each of a plurality of image frame periods in synchronization with the synchronization signal.

In an embodiment, the sensor controller may be configured to sense a first input by a touch in the first sensing mode, and to sense a second input by an input device configured to output a downlink signal in the second sensing mode.

In an embodiment, the sensor controller may be configured to output an uplink signal to the input sensor in the second sensing mode, and to receive the downlink signal from the input sensor.

According to one or more embodiments of the present disclosure, a display device includes: a display panel configured to display an image in each of a plurality of continuous image frames in synchronization with a synchronization signal; an input sensor including a first sensing electrode, and a second sensing electrode crossing the first sensing electrode and insulated from the first sensing electrode; and a sensor controller configured to transmit and receive a signal with the first sensing electrode and the second sensing electrode. The sensor controller is configured to operate in each of the image frames in a first sensing mode and a second sensing mode, and when the synchronization signal is activated while the sensor controller operates during a first sensing period in the first sensing mode, the sensor controller is configured to change an operating mode to the second sensing mode after the first sensing period is completed.

In an embodiment, the sensor controller may be configured to provide a transmit signal to the first sensing electrode in the first sensing mode, and to receive a sensing signal from the second sensing electrode, and the sensor controller may be configured to provide an uplink signal to the first sensing electrode and the second sensing electrode in the second sensing mode, and to receive a downlink signal from the first sensing electrode and the second sensing electrode.

In an embodiment, the first sensing period may be shorter in time than each of the image frames.

In an embodiment, when the synchronization signal is activated, the sensor controller may be configured to set a flag bit to a first value.

In an embodiment, the display device may further include: a panel driving circuit configured to drive the display panel, and to output the synchronization signal.

In an embodiment, the sensor controller may be configured to sense a first input by a touch in the first sensing mode, and to sense a second input by an input device configured to output a downlink signal in the second sensing mode.

According to one or more embodiments of the present disclosure, an operating method of a display device including a display panel, and an input sensor configured to operate in a first sensing mode and a second sensing mode, includes: sensing a first input from the input sensor during a first sensing period of the first sensing mode; determining whether the first sensing period is completed; determining whether a flag signal indicating a state of a synchronization signal is a first value; and in response to determining that the first sensing period is completed and the flag signal is the first value, changing an operating mode to the second sensing mode during which a second input is sensed from the input sensor.

In an embodiment, the method may further include displaying an image on the display panel during each of a plurality of continuous image frames in synchronization with the synchronization signal.

BRIEF DESCRIPTION OF THE DRAWINGS

The above and other aspects and features of the present disclosure will be more clearly understood from the following detailed description of the illustrative, non-limiting example embodiments with reference to the accompanying drawings.

FIG. 8 is a diagram illustrating an operation of an input sensor in a first sensing mode.

FIG. 12 is a flowchart illustrating an operation of a touch controller according to an embodiment of the present disclosure.

FIG. 13 is a flowchart illustrating an operation of a touch controller according to an embodiment of the present disclosure.

DETAILED DESCRIPTION

Figure 1:
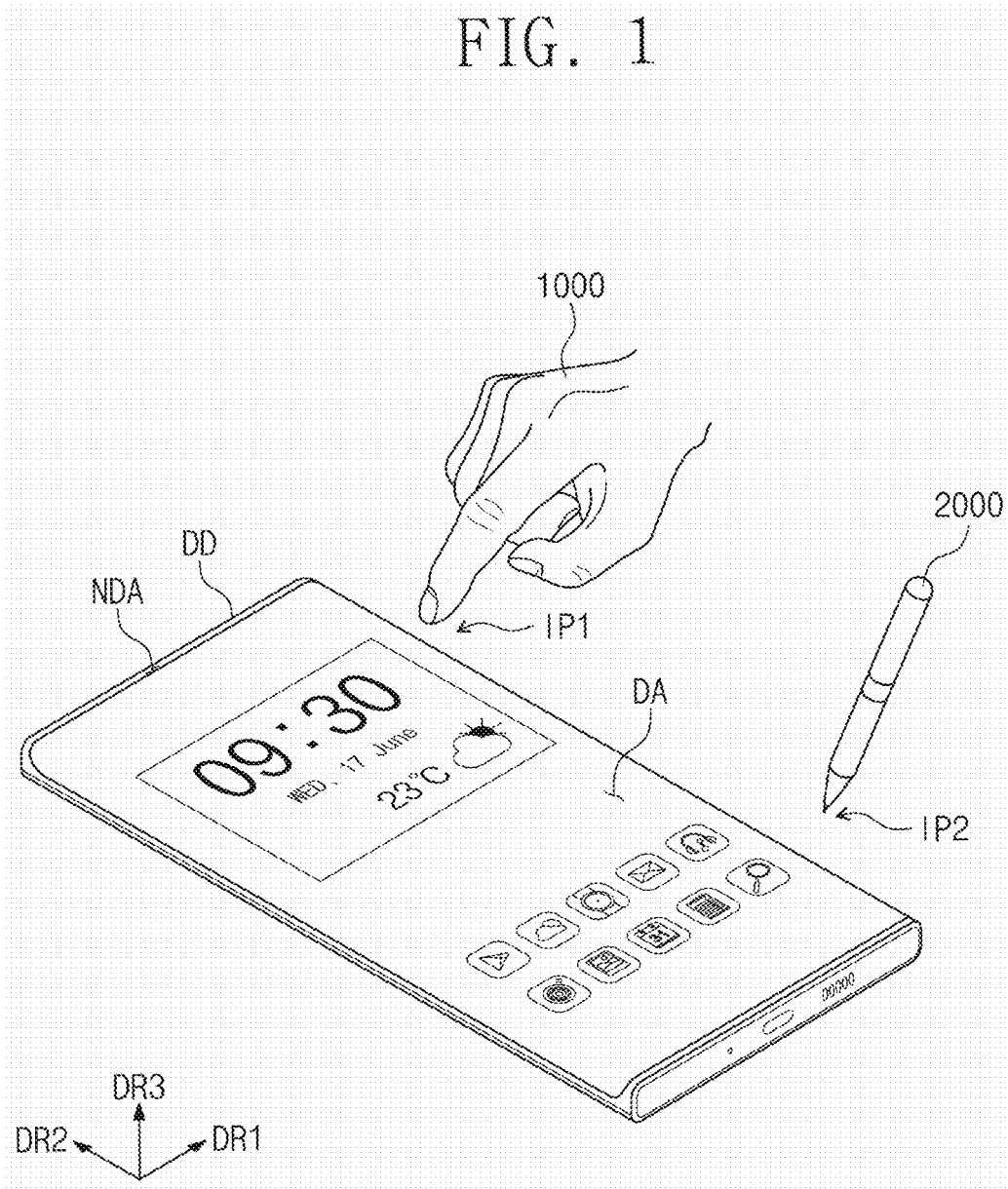
FIG. 1 is a perspective view illustrating a display device according to an embodiment of the present disclosure.

Hereinafter, example embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. These terms are relative, and are described with reference to the directions indicated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the first direction DR1, the second direction DR2, and the third direction DR3 are not limited to three axes of the rectangular coordinate system, and may be interpreted in a broader sense. For example, the first direction DR1, the second direction DR2, and the third direction DR3 may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present disclosure described herein (e.g., the main controller, the panel driving circuit, the sensor controller, and the like) may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the example embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a perspective view illustrating a display device DD according to an embodiment of the present disclosure.

Referring to FIG. 1, the display device DD may be a device that is activated according to (e.g., depending on) an electrical signal. For example, the display device DD may be a mobile phone, a tablet PC, a car navigation system, a game console, a wearable device, and the like, but the present disclosure is not limited thereto. FIG. 1 illustrates that the display device DD is a mobile phone as a representative example.

An active area DA and a peripheral area NDA may be defined in the display device DD. The display device DD may display an image through the active area DA. The active area DA may include a surface defined by a first direction DR1 and a second direction DR2. The peripheral area NDA may surround around a periphery of the active area DA.

The thickness direction of the display device DD may be parallel to or substantially parallel to a third direction DR3 crossing (e.g., intersecting with) the first direction DR1 and the second direction DR2. Accordingly, the front surfaces (or upper surfaces) and the bottom surfaces (or lower surfaces) of the members (e.g., elements and layers) constituting the display device DD may be defined based on the third direction DR3.

The display device DD may sense various inputs applied from the outside. For example, the display device DD may sense a first input IP1 by a first input means 1000, and a second input IP2 by a second input means 2000. The first input means 1000 may include all suitable input means capable of providing a change in capacitance, for example, such as a user's body part (e.g., a user's finger) and/or a passive pen. The second input means 2000 may be an active type of an input means capable of providing a driving signal, and may include, for example, an active pen (or an electronic pen).

The display device DD and the second input means 2000 may communicate with each other in both directions. The display device DD may provide an uplink signal to the second input means 2000. The second input means 2000 may provide a downlink signal to the display device DD.

Figure 2:
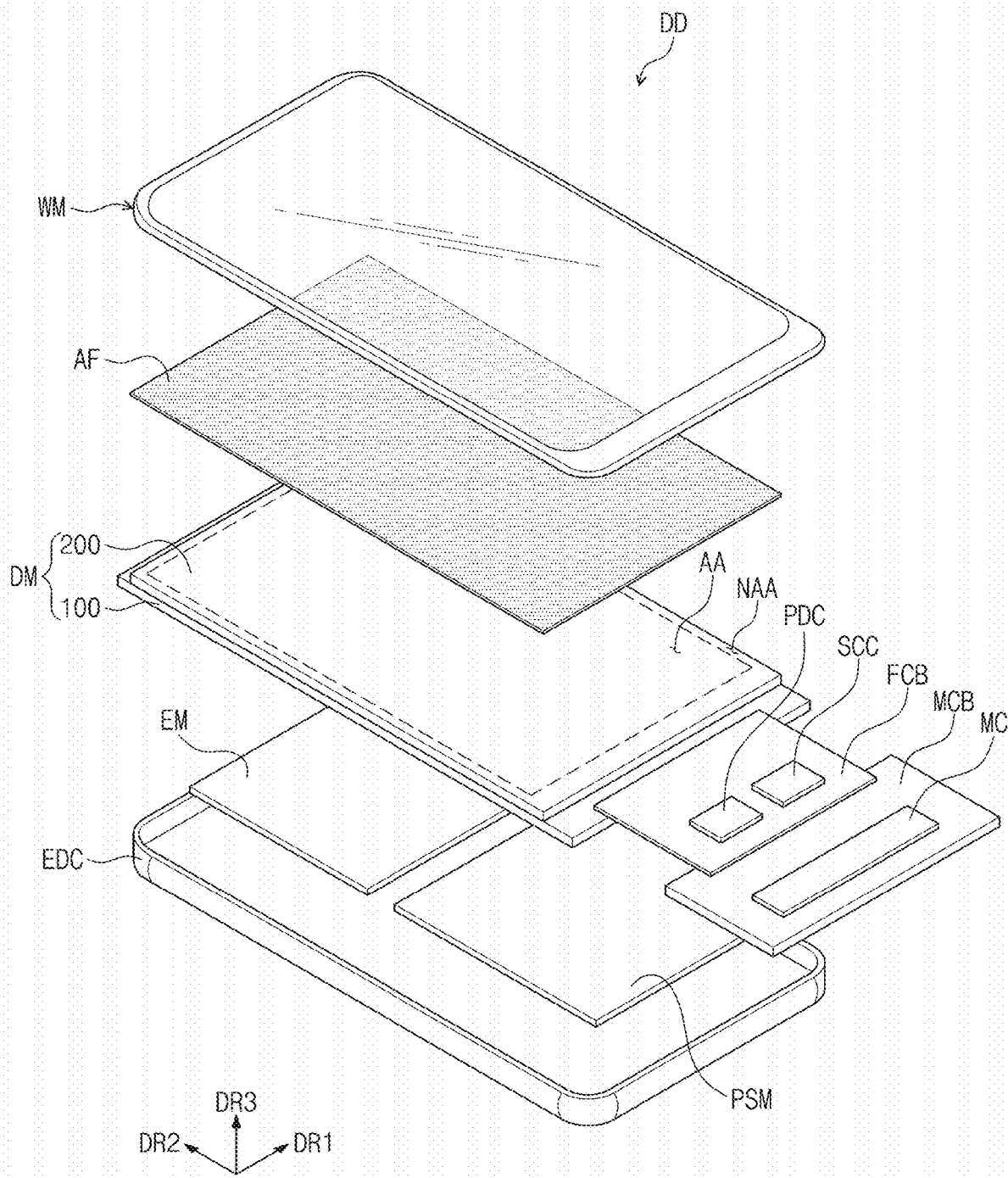
FIG. 2 is an exploded perspective view illustrating a display device according to an embodiment of the present disclosure.

FIG. 2 is an exploded perspective view illustrating the display device DD according to an embodiment of the present disclosure.

As illustrated in FIG. 2, the display device DD may include a display module (e.g., a display layer or a display circuit) DM, an optical member AF, a window WM, an electronic module (e.g., an electronic circuit) EM, a power supply module (e.g., a power supply or a power supply circuit) PSM, and a case EDC.

The display module DM generates an image, and senses an external input. The display module DM may include a display panel 100, and an input sensor 200. The display module DM includes an active area AA and a peripheral area NAA corresponding to the active area DA and the peripheral area NDA (e.g., refer to FIG. 1), respectively, of the display device DD.

The display panel 100 is not particularly limited thereto. For example, the display panel 100 may be a light emitting display panel, for example, such as an organic light emitting display panel or a quantum dot light emitting display panel. The input sensor 200 will be described in more detail below.

The display module DM may include a main circuit board MCB, a flexible circuit film FCB, a panel driving circuit PDC, and a sensor controller SCC. However, the present disclosure is not limited thereto, and one or more thereof may be omitted as needed or desired. The main circuit board MCB may be connected to the flexible circuit film FCB, and may be electrically connected to the display panel 100. The main circuit board MCB may include a plurality of driving elements. The plurality of driving elements may include a main controller MC that drives the display panel 100, and the sensor controller SCC. The flexible circuit film FCB is connected to the display panel 100 to electrically connect the display panel 100 and the main circuit board MCB to each other. The panel driving circuit PDC and the sensor controller SCC may be mounted on the flexible circuit film FCB.

The flexible circuit film FCB may be bent, such that the main circuit board MCB faces a bottom surface of the display device DD. The main circuit board MCB may be electrically connected to the electronic module EM via a connector.

The panel driving circuit PDC may be electrically connected to the display panel 100 to control the display panel 100. The sensor controller SCC may be electrically connected to the input sensor 200 to control the input sensor 200.

Each of the panel driving circuit PDC and the sensor controller SCC may be formed as an integrated circuit, and may be mounted on the flexible circuit film FCB. In an embodiment, both the panel driving circuit PDC and the sensor controller SCC may be implemented with a single integrated circuit. The panel driving circuit PDC may be referred to as a "driving controller", a "timing controller", a "signal generating circuit", or the like; and the sensor controller SCC may be variously referred to as an "input driving circuit", a "sensor driving circuit", or a "touch driving circuit".

In some embodiments, the input sensor 200 may be electrically connected to the main circuit board MCB through an additional flexible circuit film. However, the present disclosure is not limited thereto. For example, the input sensor 200 may be electrically connected to the display panel 100, and may also be electrically connected to the main circuit board MCB through the flexible circuit film FCB.

The optical member AF lowers a reflectance of external light. The optical member AF may include a polarizer and a retarder. Each of the polarizer and the retarder may have a stretched type or a coated type. In the coated optical film, the optical axis is defined in a stretching direction of a functional film. The coated optical film may include liquid crystal molecules arranged on a base film.

In an embodiment of the present disclosure, the optical member AF may be omitted. In this case, the display module DM may further include a black matrix and a color filter that replace (e.g., instead of) the optical member AF.

The window WM provides an outer surface of the display device DD. The window WM may include a base substrate, and may further include various suitable functional layers, for example, such as an anti-reflection layer and an anti-fingerprint layer.

In some embodiments, the display device DD may further include at least one adhesive layer. The adhesive layer may bond adjacent configurations (e.g., adjacent elements or layers) of the display device DD to each other. The adhesive layer may be an optically-transparent adhesive layer or a pressure-sensitive adhesive layer.

The electronic module EM may be communicably connected to at least the main controller MC. The electronic module EM may include a wireless communication module (e.g., a wireless communication circuit or device), an image input module (e.g., an image input circuit or device), a sound input module (e.g., a sound input circuit or device), a sound output module (e.g., a sound output circuit or device), memory, an external interface module (e.g., an external interface circuit or device), and the like. The modules may be mounted on the circuit board, or may be electrically connected through a flexible circuit board. The electronic module EM is electrically connected to the power supply module PSM.

The main controller MC controls overall operations of the display device DD. The main controller MC may control operations of the wireless communication module, the image input module, the sound input module, and the sound output module, as well as the display module DM. The main controller MC may include at least one microprocessor.

The case EDC may be connected to (e.g., coupled to or attached to) the window WM. The case EDC protects the configurations (e.g., the elements and layers) included in the case EDC by absorbing a shock applied from the outside, and by preventing or substantially preventing foreign objects and/or moisture from permeating through the display device DD. In an embodiment of the present disclosure, the case EDC may be provided in a form in which a plurality of storage members are connected to (e.g., coupled to or attached to) each other.

Figure 3:
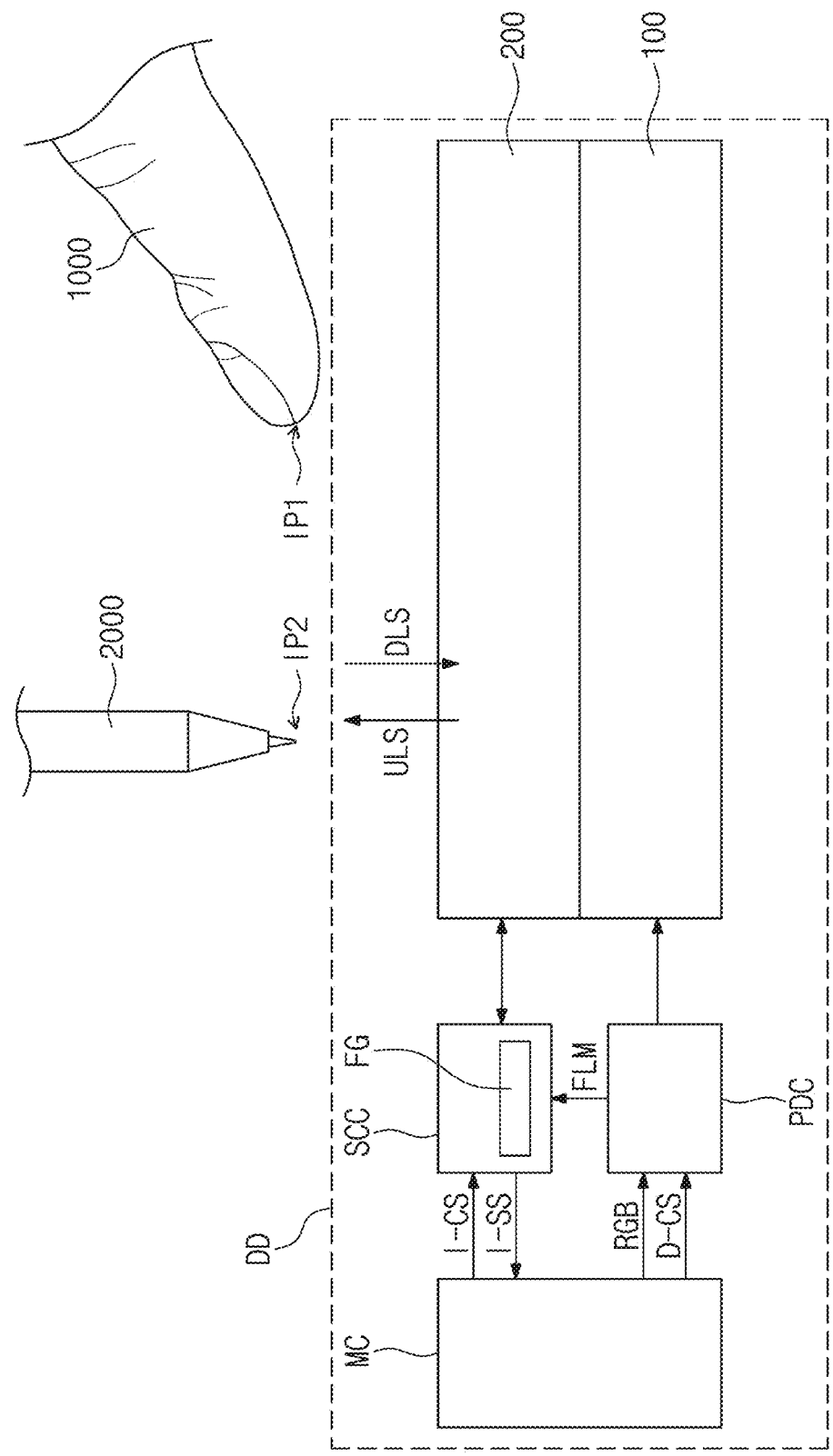
FIG. 3 is a view illustrating an operation between a display device and an input device according to an embodiment of the present disclosure.

FIG. 3 is a view illustrating an operation between a display device and an input device according to an embodiment of the present disclosure.

Referring to FIG. 3, the display device DD may sense various inputs provided from the outside. For example, the display device DD may sense the first input IP1 by the first input means 1000, and the second input IP2 by the second input means 2000.

The first input means 1000 may include all suitable input means capable of providing a change in capacitance, for example, such as a user's body part (e.g., a user's finger) or a passive-type pen. The second input means 2000 may include an electronic pen for providing a driving signal. In the example illustrated in FIG. 2, the first input means 1000 may be a user's finger, and the second input means 2000 may be an active-type active pen, but the present disclosure is not limited thereto.

The display device DD and the second input means 2000 may communicate with each other in both directions. The display device DD may provide an uplink signal ULS to the second input means 2000, and the second input means 2000 may provide a downlink signal DLS to the display device DD. In an embodiment, the uplink signal ULS may include various suitable information, for example, such as panel information, protocol version, and the like, but is not particularly limited thereto. The downlink signal DLS may include a synchronization signal or state information of the second input means 2000. In an embodiment, the downlink signal DLS may include coordinate information of the second input means 2000, battery information, slope information, and/or various desired information stored in the second input means 2000, but is not particularly limited thereto.

The display device DD may include the display panel 100, the input sensor 200, the panel driving circuit PDC, the sensor controller SCC, and the main controller MC.

The display panel 100 may have a configuration that generates or substantially generates an image. For example, the display panel 100 may be a light emitting display layer. For example, the display panel 100 may be an organic light emitting display layer, a quantum dot display layer, a micro-LED display layer, or a nano-LED display layer.

The input sensor 200 may be disposed on the display panel 100. The input sensor 200 may sense an external input applied from the outside. For example, the display device DD may sense the first input IP1 by the first input means 1000 and the second input IP2 by the second input means 2000.

The main controller MC may control overall operations of the display device DD. In an embodiment, the main controller MC may control operations of the panel driving circuit PDC and the sensor controller SCC. The main controller MC may include at least one microprocessor, and the main controller MC may be referred to as a "host". The main controller MC may further include a graphic controller.

The panel driving circuit PDC may drive the display panel 100. The panel driving circuit PDC may receive image data RGB and a driving control signal D-CS from the main controller MC. The driving control signal D-CS may include various suitable signals. In an embodiment, the driving control signal D-CS may include a vertical synchronization signal, a horizontal synchronization signal, a clock signal, a data enable signal, and the like. The panel driving circuit PDC may generate signals to be provided to the display panel 100 based on the driving control signal D-CS.

The sensor controller SCC may drive the input sensor 200. The sensor controller SCC may receive a sensor control signal I-CS from the main controller MC. The sensor control signal I-CS may include a clock signal, and a mode determination signal for determining a driving mode of the sensor controller SCC. The sensor controller SCC may operate in a first sensing mode for sensing the first input IP1 by the first input means 1000, and in a second sensing mode for sensing the second input IP2 by the second input means 2000, according to (e.g., based on) the sensor control signal I-CS.

The sensor controller SCC may calculate coordinate information of the first input IP1 or the second input IP2 based on a signal received from the input sensor 200, and may provide a coordinate signal I-SS corresponding to the coordinate information to the main controller MC. The main controller MC executes an operation corresponding to a user input based on the coordinate signal I-SS. In an embodiment, the main controller MC may drive the panel driving circuit PDC, for example, such that an image of a new application is displayed on the display panel 100.

In an embodiment, the panel driving circuit PDC provides a synchronization signal FLM to the sensor controller SCC. The sensor controller SCC may operate in the first sensing mode for sensing the first input IP1 by the first input means 1000, and in the second sensing mode for sensing the second input IP2 by the second input means 2000, in synchronization with the synchronization signal FLM from the panel driving circuit PDC. The synchronization signal FLM may be referred to as a "vertical synchronization signal" or a "start signal", indicating the start of a single frame. In the example illustrated in FIG. 3, the sensor controller SCC receives the synchronization signal FLM from the panel driving circuit PDC, but the present disclosure is not limited thereto. For example, in an embodiment, the sensor controller SCC may directly receive a synchronization signal from the main controller MC.

In an embodiment, the sensor controller SCC may include a flag register FG that stores a flag bit set to a first value (e.g., '1'), when the synchronization signal FLM is activated to be a first level (e.g., a high level).

Figure 4A:
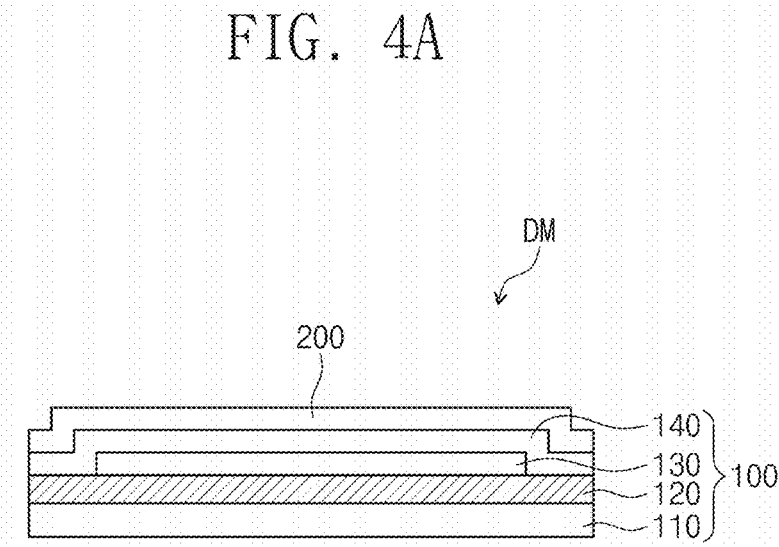
FIG. 4A is a cross-sectional view of a display module according to an embodiment of the present disclosure.

FIG. 4A is a cross-sectional view of the display module DM according to an embodiment of the present disclosure.

Referring to FIG. 4A, the display module DM may include the display panel 100 and the input sensor 200.

The display panel 100 may include a base layer 110, a circuit layer 120, a light emitting element layer 130, and an encapsulation layer 140.

The base layer 110 may be a member that provides a base surface on which the circuit layer 120 is disposed. The base layer 110 may include a glass substrate, a metal substrate, a polymer substrate, or the like. However, the present disclosure is not limited thereto, and the base layer 110 may include an inorganic layer, an organic layer, or a composite material layer.

The base layer 110 may have a multi-layered structure. For example, the base layer 110 may include a first synthetic resin layer, a silicon oxide (SiOx) layer disposed on the first synthetic resin layer, an amorphous silicon (a-Si) layer disposed on the silicon oxide layer, and a second synthetic resin layer disposed on the amorphous silicon layer. The silicon oxide layer and the amorphous silicon layer may be referred to as a "base barrier layer".

Each of the first and second synthetic resin layers may include a polyimide-based resin. In addition, each of the first and second synthetic resin layers may include at least one of an acrylic-based resin, a methacrylate-based resin, a polyisoprene-based resin, a vinyl-based resin, an epoxy-based resin, a urethane-based resin, a cellulose-based resin, a siloxane-based resin, a polyamide-based resin, and/or a perylene-based resin. As used in the present specification, "~"-based resin may refer to a resin including the functional group of "~".

The circuit layer 120 may be disposed on the base layer 110. The circuit layer 120 may include an insulating layer, a semiconductor pattern, a conductive pattern, a signal line, and the like. The insulating layer, a semiconductor layer, and a conductive layer may be formed on the base layer 110 in any suitable manner, for example, such as coating, evaporation, or the like. Afterwards, the insulating layer, the semiconductor layer, and the conductive layer may be selectively patterned by performing a photolithography process a plurality of times. Afterwards, the semiconductor pattern, the conductive pattern, and the signal line included in the circuit layer 120 may be formed.

The light emitting element layer 130 may be disposed on the circuit layer 120. The light emitting element layer 130 may include a light emitting element. For example, the light emitting element layer 130 may include an organic light emitting material, a quantum dot, a quantum rod, a micro-LED, or a nano-LED.

The encapsulation layer 140 may be disposed on the light emitting element layer 130. The encapsulation layer 140 may protect the light emitting element layer 130 from foreign objects, for example, such as moisture, oxygen, and dust particles.

The input sensor 200 may be disposed on the display panel 100. The input sensor 200 may sense an external input applied from the outside. The external input may be a user input. The user input may include various suitable kinds of external inputs, for example, such as a portion of the user's body (e.g., a user's finger), light, heat, pens (e.g., active pens and/or passive pens), pressure, and/or the like.

The input sensor 200 may be formed on the display panel 100 through a successive process. In this case, it may be expressed that the input sensor 200 is directly disposed on the display panel 100. The expression "directly disposed" may mean that a third component is not interposed between the input sensor 200 and the display panel 100. In other words, a separate adhesive member may not be interposed between the input sensor 200 and the display panel 100.

As another example, the input sensor 200 may be connected to (e.g., coupled to or attached to) the display panel 100 through an adhesive member. The adhesive member may include a common adhesive, or a common sticking agent.

In some embodiments, the display device DD may further include anti-reflection layer and an optical layer, which are disposed on the input sensor 200. The anti-reflection layer may reduce a reflectance of external light incident from the outside of the display device DD. The optical layer may improve a front luminance of the display device DD by controlling a direction of light incident from the display panel 100.

Figure 4B:
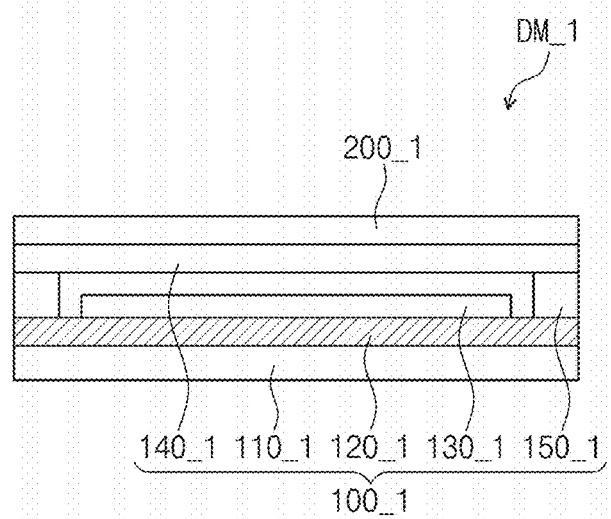
FIG. 4B is a cross-sectional view of a display module according to an embodiment of the present disclosure.

FIG. 4B is a cross-sectional view of a display module DM_1 according to an embodiment of the present disclosure.

Referring to FIG. 4B, the display module DM_1 may include a display panel 100_1 and an input sensor 200_1. The display panel 1001 may include a base substrate 110_1, a circuit layer 120_1, a light emitting element layer 130_1, an encapsulation substrate 140_1, and a coupling member 150_1.

Each of the base substrate 110_1 and the encapsulation substrate 140_1 may include a glass substrate, a metal substrate, or a polymer substrate, but the present disclosure is not particularly limited thereto.

The coupling member 150_1 may be interposed between the base substrate 110_1 and the encapsulation substrate 140_1. The coupling member 150_1 may connect (e.g., may couple or attach) the encapsulation substrate 140_1 to the base substrate 110_1 or the circuit layer 120_1. The coupling member 150_1 may include an inorganic material or an organic material. For example, the inorganic material may include a frit seal, and the organic material may include a photo-curable resin or a photo-plastic resin. However, the material constituting the coupling member 150_1 is not limited to these examples.

The input sensor 2001 may be directly disposed on the encapsulation substrate 140_1. The expression "directly disposed" may mean that a third component is not interposed between the input sensor 200_1 and the encapsulation substrate 140_1. In other words, a separate adhesive member may not be interposed between the input sensor 200_1 and the display panel 100_1. However, the present disclosure is not limited thereto, and an adhesive layer may be further interposed between the input sensor 200_1 and the encapsulation substrate 140_1.

Figure 5:
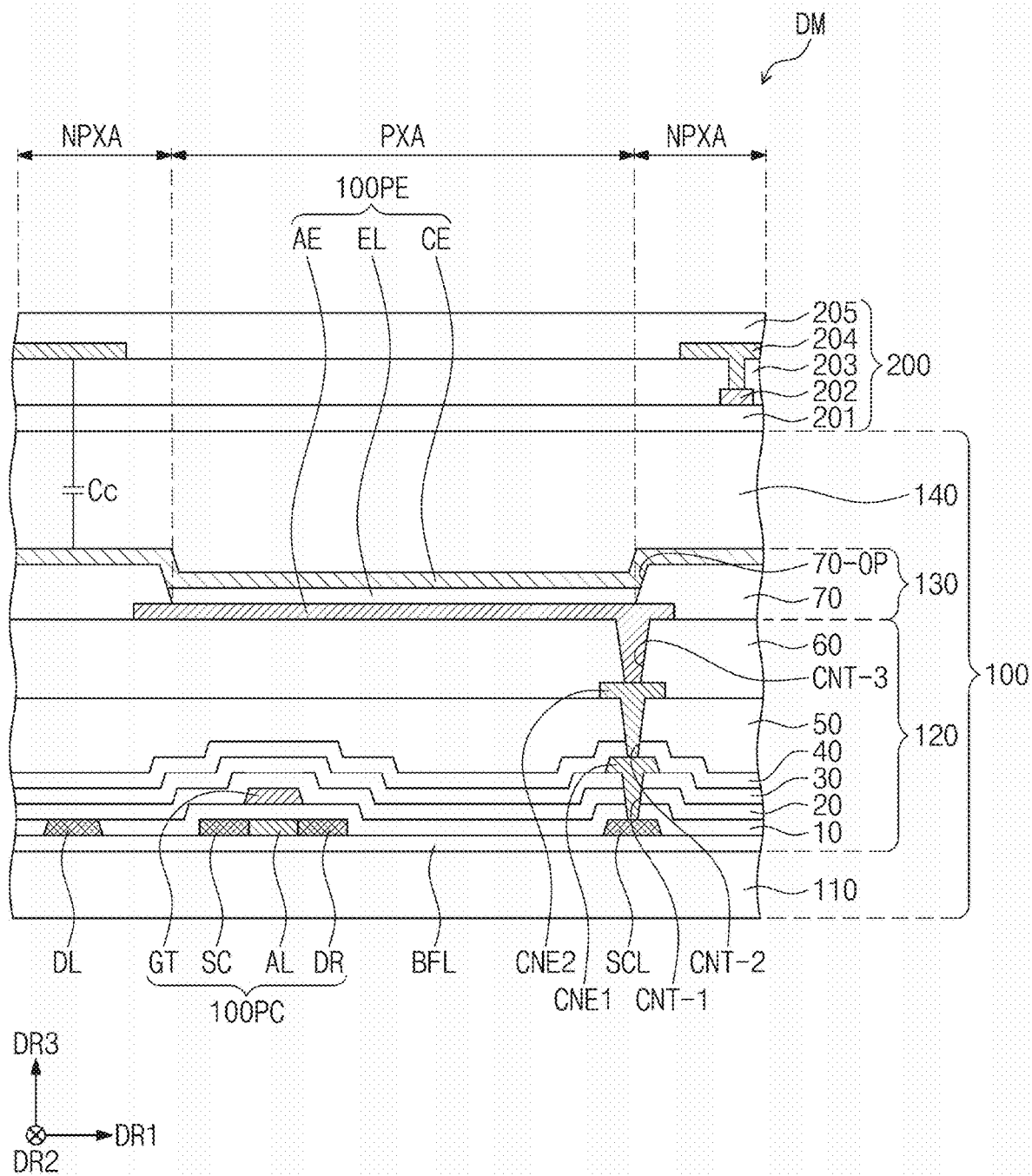
FIG. 5 is a cross-sectional view of a display module according to an embodiment of the present disclosure.

FIG. 5 is a cross-sectional view of the display module DM according to an embodiment of the present disclosure.

Referring to FIG. 5, at least one inorganic layer is formed on the upper surface of the base layer 110. The inorganic layer may include at least one of aluminum oxide, titanium oxide, silicon oxide, silicon nitride, silicon oxynitride, zirconium oxide, and/or hafnium oxide. The inorganic layer may be formed in multi-layers. The multi-layered inorganic layers may constitute a barrier layer and/or a buffer layer. In an embodiment, as shown in FIG. 5, the display panel 100 may include a buffer layer BFL.

The buffer layer BFL may improve a bonding strength between the base layer 110 and a semiconductor pattern. The buffer layer BFL may include at least one of silicon oxide, silicon nitride, and/or silicon oxynitride. For example, the buffer layer BFL may include a structure in which a silicon oxide layer and a silicon nitride layer are alternately stacked.

The semiconductor pattern may be disposed on the buffer layer BFL. The semiconductor pattern may include polysilicon. However, the present disclosure is not limited thereto, and the semiconductor pattern may include amorphous silicon, low-temperature polycrystalline silicon, or an oxide semiconductor.

FIG. 5 illustrates only a part of the semiconductor pattern, and the semiconductor pattern may be further disposed in other areas. The semiconductor pattern may be arranged in a specific rule throughout pixels. The semiconductor pattern may have an electrical characteristic that is different depending on whether the semiconductor pattern is doped. The semiconductor pattern may include a first area having high conductivity, and a second area having low conductivity. The first area may be doped with an N-type dopant or a P-type dopant. A P-type transistor may include a doping area doped with the P-type dopant, and an N-type transistor may include a doping area doped with the N-type dopant. The second area may be a non-doping area, or an area doped with a concentration lower than a concentration in the first area.

A conductivity of the first area is greater than a conductivity of the second area. The first area may operate or substantially operate as an electrode or a signal line. The second area may correspond or substantially correspond to an active region (or a channel) of a transistor. In other words, a part of the semiconductor pattern may be an active region of the transistor. Another part thereof may be a source or drain of the transistor. Another part may be a connection electrode or a connection signal line.

Figure 6:
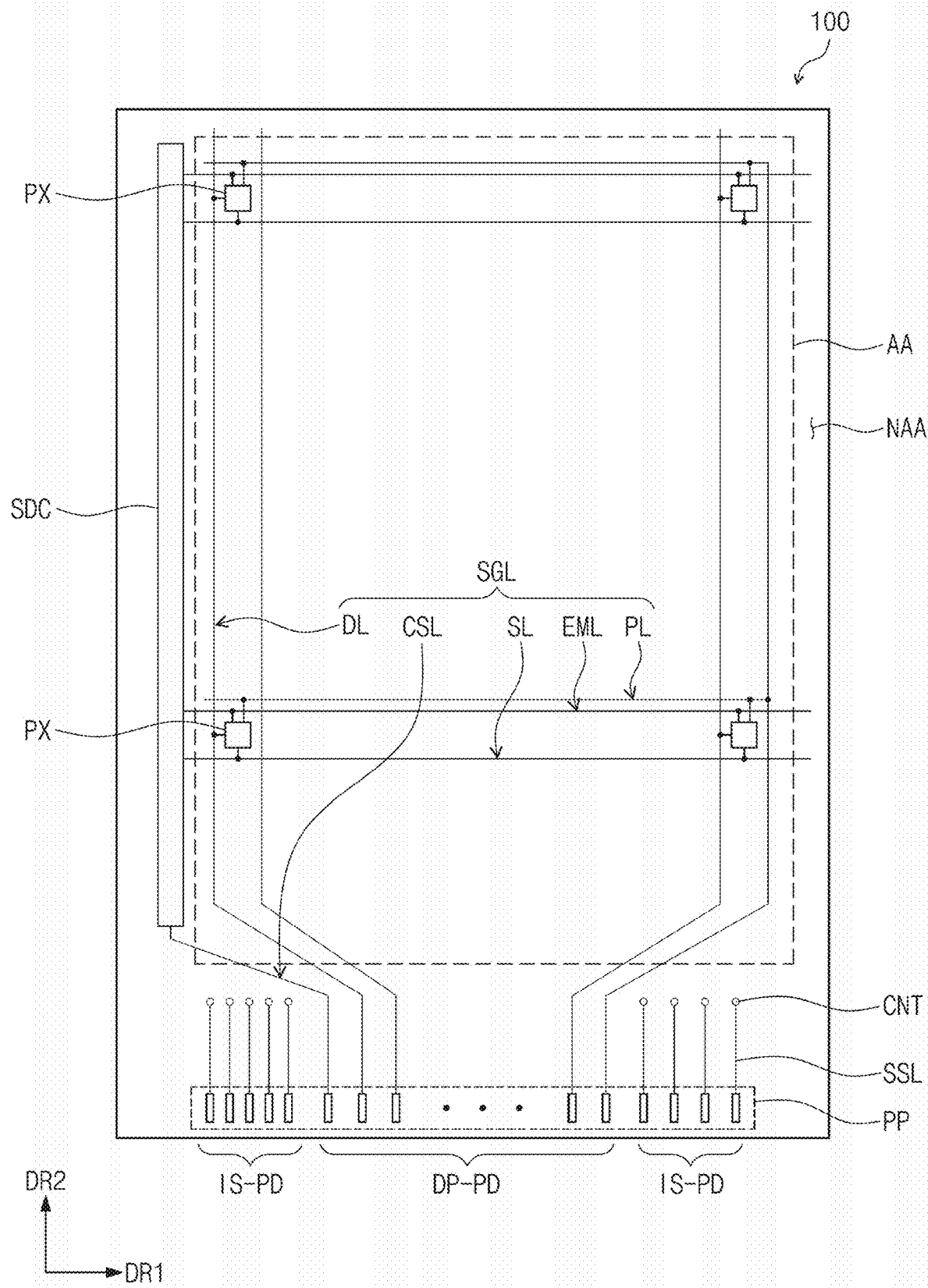
FIG. 6 is a plan view of a display panel according to an embodiment of the present disclosure.

The display panel 100 may include a plurality of pixels PX (e.g., refer to FIG. 6). In an embodiment, each of the pixels PX may include a plurality of transistors, a capacitor, and a light emitting element. FIG. 5 illustrates only one transistor 100PC from among the plurality of transistors, and a light emitting element 100PE that is included in a corresponding one of the pixels PX.

A source SC, an active (e.g., an active region) AL, and a drain DR of the transistor 100PC may be formed by using a semiconductor pattern. The source SC and the drain DR may be extended in directions opposite to each other from the active AL on a cross section. A part of a connection signal wire SCL that is formed by using the semiconductor pattern is illustrated in FIG. 5. Although not separately illustrated in FIG. 5, the connection signal wire SCL may be connected to the drain DR of the transistor 100PC in a plan view (e.g., a view from a direction that is perpendicular to or substantially perpendicular to a surface of a target member, element, or layer). Further, a part of a data line DL that is formed from the semiconductor pattern is illustrated in FIG. 5. Although not separately illustrated in FIG. 5, the data line DL may be connected to one of a drain or a source of a transistor that is not illustrated in the drawing.

A first insulating layer 10 may be disposed on the buffer layer BFL. The first insulating layer 10 may overlap with a plurality of pixels in common, and may cover the semiconductor pattern. The first insulating layer 10 may be an inorganic layer and/or an organic layer, and may have a single layer structure or a multi-layered structure. The first insulating layer 10 may include at least one of aluminum oxide, titanium oxide, silicon oxide, silicon nitride, silicon oxynitride, zirconium oxide, and/or hafnium oxide. In an embodiment, the first insulating layer 10 may be a single-layer silicon oxide layer. In addition to the first insulating layer 10, an insulating layer of the circuit layer 120, which will be described in more detail below, may be an inorganic layer and/or an organic layer, and may have a single layer structure or a multi-layered structure. The inorganic layer may include at least one of the above-described materials, but the present disclosure is not limited thereto.

A gate GT of the transistor 100PC is disposed on the first insulating layer 10. The gate GT may be a part of a metal pattern. The gate GT overlaps with the active AL. In a process of doping the semiconductor pattern, the gate GT may function as a mask.

A second insulating layer 20 is disposed on the first insulating layer 10, and may cover the gate GT. The second insulating layer 20 may overlap with the pixels in common. The second insulating layer 20 may be an inorganic layer and/or an organic layer, and may have a single layer structure or a multi-layered structure. The second insulating layer 20 may include at least one of silicon oxide, silicon nitride, and/or silicon oxynitride. In an embodiment, the second insulating layer 20 may have a multi-layered structure including a silicon oxide layer and a silicon nitride layer.

A third insulating layer 30 may be disposed on the second insulating layer 20. The third insulating layer 30 may have a single layer structure or a multi-layered structure. In an embodiment, the third insulating layer 30 may have a multi-layered structure including a silicon oxide layer and a silicon nitride layer.

A first connection electrode CNE1 may be disposed on the third insulating layer 30. The first connection electrode CNE1 may be connected to the connection signal wire SCL through a contact hole CNT-1 penetrating the first, second, and third insulating layers 10, 20, and 30.

A fourth insulating layer 40 may be disposed on the third insulating layer 30. The fourth insulating layer 40 may be a silicon oxide layer having a single layer. A fifth insulating layer 50 may be disposed on the fourth insulating layer 40. The fifth insulating layer 50 may be an organic layer.

A second connection electrode CNE2 may be disposed on the fifth insulating layer 50. The second connection electrode CNE2 may be connected to the first connection electrode CNE1 through a contact hole CNT-2 penetrating the fourth insulating layer 40 and the fifth insulating layer 50.

A sixth insulating layer 60 may be disposed on the fifth insulating layer 50, and may cover the second connection electrode CNE2. The sixth insulating layer 60 may be an organic layer.

The light emitting element layer 130 may be disposed on the circuit layer 120. The light emitting element layer 130 may include the light emitting element 100PE. For example, the light emitting element layer 130 may include an organic light emitting material, a quantum dot, a micro-LED, or a nano-LED. Hereinafter, for convenience, the light emitting element 100PE is described in more detail as an organic light emitting device, but the present disclosure is not particularly limited thereto.

The light emitting element 100PE may include a first electrode AE, a light emitting layer EL, and a second electrode CE.

The first electrode AE may be disposed on the sixth insulating layer 60. The first electrode AE may be connected to the second connection electrode CNE2 through a contact hole CNT-3 penetrating the sixth insulating layer 60.

A pixel defining film 70 may be disposed on the sixth insulating layer 60, and may cover a part of the first electrode AE. An opening 70-OP is defined on the pixel defining film 70. The opening 70-OP of the pixel defining film 70 exposes at least part of the first electrode AE.

The active area DA (e.g., refer to FIG. 1) may include a light emitting area PXA, and a non-light emitting area NPXA adjacent to the light emitting area PXA. The non-light emitting area NPXA may surround (e.g., around a periphery of) the light emitting area PXA. In an embodiment, the light emitting area PXA is defined to correspond to a partial area of the first electrode AE that is exposed by the opening 70-OP.

The light emitting layer EL may be disposed on the first electrode AE. The light emitting layer EL may be disposed at (e.g., in or on) an area corresponding to the opening 70-OP. In other words, the light emitting layer EL may be separately formed on each of the pixels. When the light emitting layer EL is separately formed on each of the pixels, each of the light emitting layers EL may emit light of at least one suitable color from among, for example, blue, red, and green. However, the present disclosure is not limited thereto, and the light emitting layer EL may be connected to and provided in each of the pixels in common. In this case, the light emitting layer EL may provide a blue light or a white light.

The second electrode CE may be disposed on the light emitting layer EL. The second electrode CE may be integrally disposed in a plurality of pixels in common.

In some embodiments, a hole control layer may be interposed between the first electrode AE and the light emitting layer EL. The hole control layer may be disposed at (e.g., in or on) the light emitting area PXA and the non-light emitting area NPXA in common. The hole control layer may include a hole transport layer, and may further include a hole injection layer. An electron control layer may be interposed between the light emitting layer EL and the second electrode CE. The electron control layer may include an electron transport layer, and may further include an electron injection layer. The hole control layer and the electron control layer may be formed in common in a plurality of pixels using an open mask.

The encapsulation layer 140 may be disposed on the light emitting element layer 130. The encapsulation layer 140 may include an inorganic layer, an organic layer, and an inorganic layer, which are sequentially stacked, but the layers constituting the encapsulation layer 140 are not limited thereto.

The inorganic layers may protect the light emitting element layer 130 from moisture and oxygen; and the organic layer may protect the light emitting element layer 130 from foreign objects, for example, such as dust particles. The inorganic layers may include a silicon nitride layer, a silicon oxynitride layer, a silicon oxide layer, a titanium oxide layer, an aluminum oxide layer, or the like. The organic layer may include an acrylic-based organic layer, but the present disclosure is not limited thereto.

The input sensor 200 may include a base layer 201, a first conductive layer 202, a sensing insulating layer 203, a second conductive layer 204, and a cover insulating layer 205.

The base layer 201 may include an inorganic layer including at least one of silicon nitride, silicon oxynitride, and/or silicon oxide. As another example, the base layer 201 may be an organic layer including an epoxy resin, an acrylic resin, or an imide-based resin. The base layer 201 may have a single layer structure, or may have a multi-layered structure that is stacked in the third direction DR3.

Each of the first conductive layer 202 and the second conductive layer 204 may have a single layer structure, or may have a multi-layered structure that is stacked in the third direction DR3.

A conductive layer of a single layer structure may include a metal layer or a transparent conductive layer. The metal layer may include molybdenum, silver, titanium, copper, aluminum, or an alloy thereof. The transparent conductive layer may include a transparent conductive oxide, for example, such as indium tin oxide (ITO), indium zinc oxide (IZO), zinc oxide (ZnO), indium zinc tin oxide (IZTO), or the like. The transparent conductive layer may include a conductive polymer, for example, such as PEDOT, a metal nano wire, graphene, and/or the like.

A conductive layer of the multi-layered structure may include a plurality of metal layers. For example, the metal layers may have a three-layered structure of titanium/aluminum/titanium. The conductive layer of the multi-layered structure may include at least one metal layer, and at least one transparent conductive layer.

At least one of the sensing insulating layer 203 and the cover insulating layer 205 may include an inorganic film. The inorganic film may include at least one of aluminum oxide, titanium oxide, silicon oxide, silicon nitride, silicon oxynitride, zirconium oxide, and/or hafnium oxide.

At least one of the sensing insulating layer 203 and the cover insulating layer 205 may include an organic layer. The organic layer may include at least one of an acrylic-based resin, a methacrylate-based resin, a polyisoprene-based resin, a vinyl-based resin, an epoxy-based resin, a urethane-based resin, a cellulose-based resin, a siloxane-based resin, a polyimide-based resin, a polyamide-based resin, and/or a perylene-based resin.

A parasitic capacitance Cc may be formed between the second conductive layer 204 of the input sensor 200 and the second electrode CE.

A signal transmitted through the second conductive layer 204 may be a signal corresponding to one of the uplink signal ULS and/or the downlink signal DLS (e.g., refer to FIG. 3). Each of the uplink signal ULS and the downlink signal DLS may be a signal that periodically transitions to a first level (or an active level) and a second level (or an inactive level). As a signal level of the signal transmitted through the second conductive layer 204 is periodically changed, the parasitic capacitance Cc between the second conductive layer 204 and the second electrode CE may vary. In this case, the display quality of an image displayed on the display panel 100 may deteriorate.

FIG. 6 is a plan view of the display panel 100 according to an embodiment of the present disclosure.

As illustrated in FIG. 6, the display panel 100 may include a scan driving circuit SDC, a plurality of signal lines SGL (hereinafter referred to as "signal lines"), a plurality of signal pads DP-PD and IS-PD (hereinafter referred to as "signal pads"), and a plurality of pixels PX (hereinafter referred to as "pixels").

The scan driving circuit SDC generates a plurality of scan signals (hereinafter referred to as "scan signals"), and sequentially outputs the scan signals to a plurality of scan lines SL (hereinafter referred to as "scan lines"), which will be described in more detail below. The scan driving circuit SDC may also output other control signals to the pixels PX, in addition to the scan signals.

The scan driving circuit SDC may include a plurality of transistors formed through the same or substantially the same process as a process in which the transistors in the pixels PX are formed.

The signal lines SGL may include the scan lines SL, data lines DL, a power supply line PL, light emitting control lines EML, and a control signal line CSL. Each of the scan lines SL is connected to corresponding pixels PX from among the pixels PX; each of the data lines DL is connected to corresponding pixels PX from among the pixels PX; and each of the light emitting control lines EML is connected to corresponding pixels PX from among the pixels PX. The power supply line PL is connected in common with the pixels PX. The control signal line CSL may provide control signals to the scan driving circuit SDC. The power supply line PL may provide a suitable voltage used for operations of the pixels PX. The power supply line PL may include a plurality of lines that provide different voltages from one another.

In an embodiment, the signal lines SGL may further include auxiliary lines SSL. Each of the auxiliary lines SSL refers to a signal line that is electrically connected to the input sensor 200 (e.g., refer to FIG. 7). In an embodiment of the present disclosure, the auxiliary lines SSL may be omitted. The auxiliary lines SSL are connected to contact holes CNT, respectively. The auxiliary lines SSL may be electrically connected to signal lines of the input sensor 200 (e.g., refer to FIG. 7), which will be described in more detail below, through the contact holes CNT.

The signal pads DP-PD and IS-PD may include first (e.g., first-type) signal pads DP-PD connected to the data lines DL, the power supply line PL, and the control signal line CSL, and second (e.g., second-type) signal pads IS-PD connected to the auxiliary lines SSL. The first signal pads DP-PD and the second signal pads IS-PD are disposed to be adjacent to each other at (e.g., in or on) a pad area PP defined at (e.g., in or on) a partial area of the peripheral area NAA. A stacked structure of the first signal pads DP-PD may not be distinguished from a stacked structure of the second signal pads IS-PD; and structure materials of the first signal pads DP-PD may not be distinguished from structure materials of the second signal pads IS-PD. The signal pads DP-PD and IS-PD may be formed through the same process as each other.

The active area AA may be defined as an area at (e.g., in or on) which the pixels PX are disposed. A plurality of electronic elements are disposed at (e.g., in or on) the active area AA. The electronic elements include the organic light emitting diodes of the pixels PX, and pixel driving circuits connected to the organic light emitting diodes. The circuit layer 120 illustrated in FIG. 5 may include the scan driving circuit SDC, the signal lines SGL, the signal pads DP-PD and IS-PD, and the pixel driving circuits.

Each of the pixels PX may include a plurality of transistors, a capacitor, and an organic light emitting diode. The pixels PX are electrically connected to the scan lines SL, the data lines DL, the light emitting control lines EML, and the power supply line PL, and radiate (e.g., emit) light in response to signals received through the scan lines SL, the data lines DL, the light emitting control lines EML, and the power supply line PL.

The signal pads DP-PD and IS-PD of the display panel 100 may be electrically connected to the flexible circuit film FCB illustrated in FIG. 2.

A part of the display panel 100 illustrated in FIG. 4 may be bent. For example, a part of the peripheral area NAA of the display panel 100 may be bent, and may be bent around a bending axis that is parallel to or substantially parallel to the first direction DR1. The bending axis may be defined to overlap with a part of the control signal line CSL, a part of the data lines DL, and a part of the auxiliary lines SSL.

Figure 7:
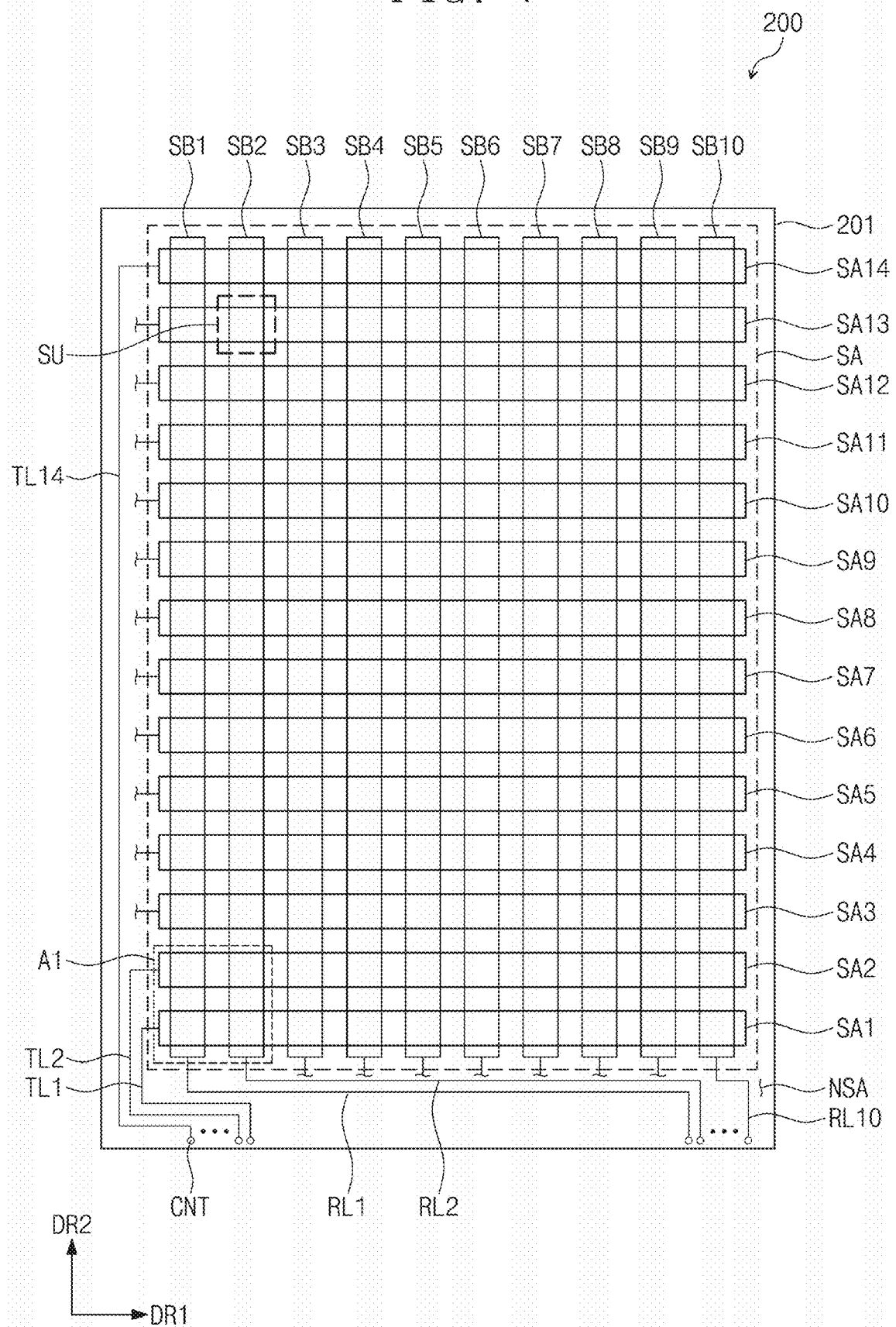
FIG. 7 is a plan view of an input sensor according to an embodiment of the present disclosure.

FIG. 7 is a plan view of the input sensor 200 according to an embodiment of the present disclosure.

Referring to FIG. 7, the input sensor 200 may include a sensing area SA and a non-sensing area NSA. The sensing area SA may be an area activated according to (e.g., depending on) an electrical signal. In an embodiment, the sensing area SA may be an area at (e.g., in or on) which an input is sensed. The non-sensing area NSA may surround (e.g., around a periphery of) the sensing area SA. The sensing area SA may correspond to (e.g., may overlap with) the active area AA, and the non-sensing area NSA may correspond to (e.g., may overlap with) the peripheral area NAA (e.g., see FIG. 6).

The input sensor 200 includes first sensing electrodes SA1 to SA14, and second sensing electrodes SB1 to SB10, which are formed on the base layer 201. The first sensing electrodes SA1 to SA14 and the second sensing electrodes SB1 to SB10 are disposed at (e.g., in or on) the sensing area SA. The first sensing electrodes SA1 to SA14 and the second sensing electrodes SB1 to SB10 are electrically insulated from each other, and cross each other within the sensing area SA. In an embodiment of the present disclosure, the input sensor 200 includes the first sensing electrodes SA1 to SA14 and the second sensing electrodes SB1 to SB10, but the present disclosure is not limited thereto. The number of first sensing electrodes and the number of second sensing electrodes may be variously modified as needed or desired. FIG. 7 illustrates that the number of first sensing electrodes is greater than the number of second sensing electrodes. However, in an embodiment, the number of second sensing electrodes may be greater than or equal to the number of first sensing electrodes.

The input sensor 200 may obtain location information of an external input through a change in a mutual capacitance between the first sensing electrodes SA1 to SA14 and the second sensing electrodes SB1 to SB10.

The input sensor 200 may further include first to fourteenth transmission lines TL1 to TL14, and first to tenth reception lines RL1 to RL10. The first to fourteenth transmission lines TL1 to TL14 and the first to tenth reception lines RL1 to RL10 may be disposed at (e.g., in or on) the non-sensing area NSA. The first to fourteenth transmission lines TL1 to TL14 are electrically connected to sides of the first sensing electrodes SA1 to SA14, respectively. The first to tenth reception lines RL1 to RL10 are electrically connected to sides of the second sensing electrodes SB1 to SB10, respectively. However, the present disclosure is not limited thereto. In an embodiment of the present disclosure, the input sensor 200 may further include reception lines that are electrically connected to other sides (e.g., opposite sides) of the second sensing electrodes SB1 to SB10, respectively.

One crossing region of the first sensing electrodes SA1 to SA14 and the second sensing electrodes SB1 to SB10 may be defined as one sensing unit (e.g., one sensing region) SU.

The first to fourteenth transmission lines TL1 to TL14 and the first to tenth reception lines RL1 to RL10 may be electrically connected to the auxiliary lines SSL through the contact holes CNT (e.g., see FIG. 6).

FIG. 8 is a diagram illustrating an operation of an input sensor in a first sensing mode.

Referring to FIGS. 7 and 8, each of the first sensing electrodes SA1 to SA14 may operate as a transmission electrode. Each of the second sensing electrodes SB1 to SB10 may operate as a reception electrode. In the first sensing mode, the sensor controller SCC may sense an external input by sensing an amount of change in the mutual capacitance formed between the first sensing electrodes SA1 to SA14 and the second sensing electrodes SB1 to SB10.

For convenience of illustration, FIG. 8 shows only the first sensing electrodes SA1 and SA2 from among the first sensing electrodes SA1 to SA14 illustrated in FIG. 7, and the second sensing electrodes SB1 and SB2 from among the second sensing electrodes SB1 to SB10 illustrated in FIG. 7. The first sensing electrodes SA3 to SA14 and the second sensing electrodes SB3 to SB10 illustrated in FIG. 7 may also be driven in the same or substantially the same manner as those of the first sensing electrodes SA1 and SA2 and the second sensing electrodes SB1 and SB2, and thus, redundant description thereof may not be repeated.

The sensor controller SCC may provide transmit signals TX1 and TX2 to the first sensing electrodes SA1 and SA2, respectively. The sensor controller SCC may receive sensing signals RX1 and RX2 from the second sensing electrodes SB1 and SB2, respectively. Accordingly, the sensor controller SCC may compare the transmit signals TX1 and TX2 with the sensing signals RX1 and RX2 corresponding to the transmit signals TX1 and TX2, respectively, and may generate a coordinate value of a location at which the first input IP1 is provided by the first input means 1000 (e.g., refer to FIG. 1) based on the amount of change in the sensing signals RX1 and RX2.

Figure 9A:
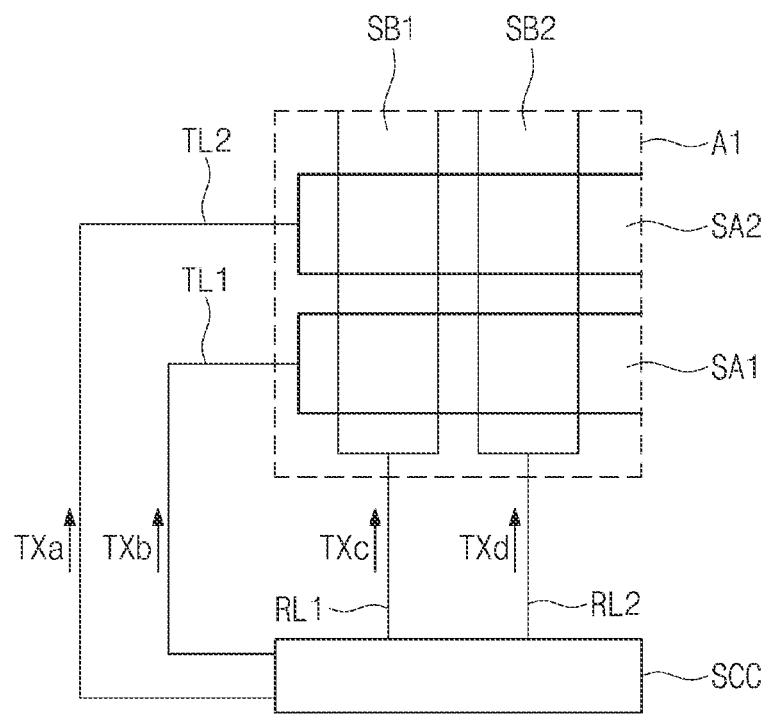
FIGS. 9A-9B are diagrams illustrating an operation of an input sensor in a second sensing mode.
Figure 9B:
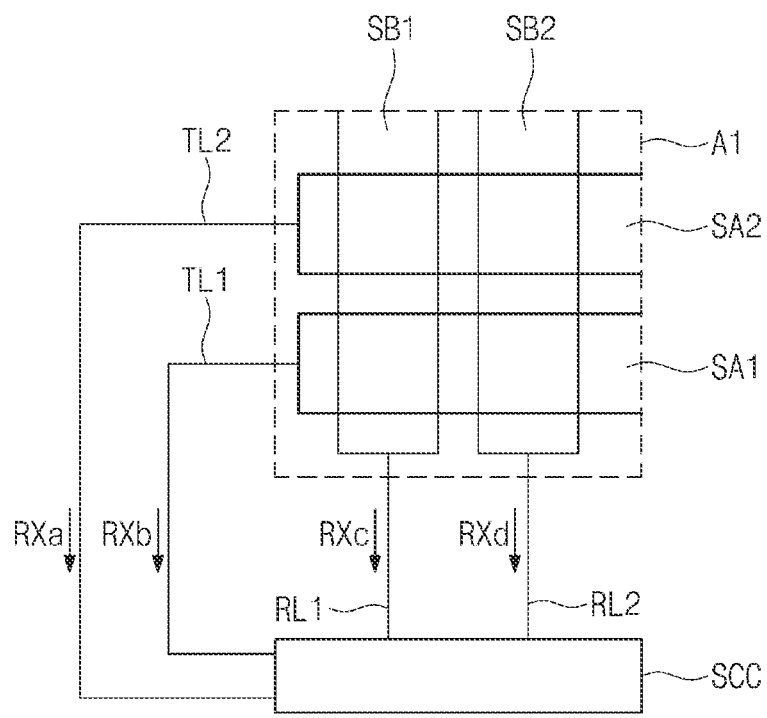

FIGS. 9A and 9B are diagrams illustrating an operation of an input sensor in a second sensing mode.

Referring to FIGS. 9A and 9B, in the second sensing mode, the sensor controller SCC may operate (e.g., may concurrently or simultaneously operate) the first sensing electrodes SA1 and SA2 and the second sensing electrodes SB1 and SB2 as transmit electrodes or as receive electrodes.

Referring to FIG. 9A, during a suitable period (e.g., a predetermined period) (hereinafter, referred to as a "first period"), each of the first sensing electrodes SA1 and SA2 and the second sensing electrodes SB1 and SB2 receives a corresponding one of uplink signals TXa, TXb, TXc, and TXd from the sensor controller SCC. During the first period, each of the first sensing electrodes SA1 and SA2 and the second sensing electrodes SB1 and SB2 may operate as the transmit electrode that provides the second input means 2000 (e.g., refer to FIG. 3) with the uplink signals TXa, TXb, TXc, and TXd.

Referring to FIG. 9B, during a suitable period (e.g., predetermined period) (hereinafter, referred to as "a second period") after the first period, each of the first sensing electrodes SA1 and SA2 and the second sensing electrodes SB1 and SB2 receives a corresponding one of downlink signals RXa, RXb, RXc, and RXd provided by the second input means 2000. During the second period, each of the first sensing electrodes SA1 and SA2 and the second sensing electrodes SB1 and SB2 may operate as the receive electrode that provides the sensor controller SCC with the downlink signals RXa, RXb, RXc, and RXd. In other words, during a suitable period (e.g., a specific or predetermined period), all of the first sensing electrodes SA1 and SA2 and the second sensing electrodes SB1 and SB2 may be utilized as transmit electrodes or receive electrodes.

Figure 10:
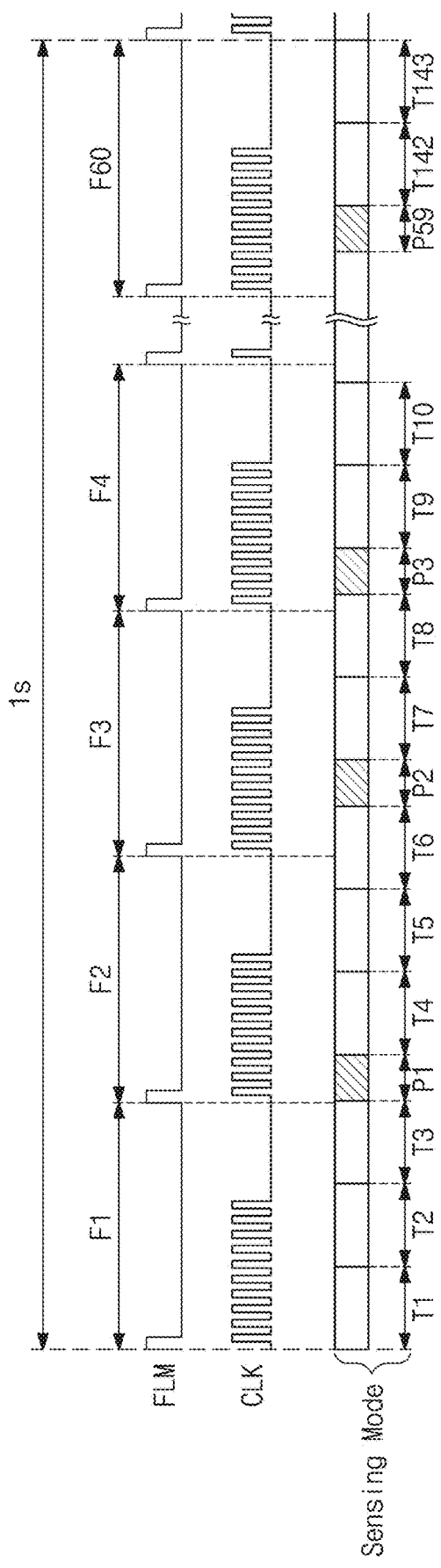
FIG. 10 is a timing diagram illustrating operations of an input sensor and a sensor controller according to an embodiment of the present disclosure.

FIG. 10 is a timing diagram illustrating operations of the input sensor 200 and the sensor controller SCC according to an embodiment of the present disclosure.

Referring to FIGS. 3 and 10, the synchronization signal FLM and a clock signal CLK may be signals used inside the panel driving circuit PDC. The synchronization signal FLM may be a signal indicating the start of an image frame. The clock signal CLK may be a signal indicating the start of a line. The clock signal CLK may be referred to as a "main clock signal", a "horizontal clock signal", a "horizontal synchronization signal", or the like.

The scan driving circuit SDC (e.g., see FIG. 6) may start an image frame in synchronization with the synchronization signal FLM, may generate a plurality of scan signals (hereinafter, may be referred to as "scan signals") for each image frame in synchronization with the clock signal CLK, and may sequentially output the plurality of scan signals to the plurality of scan lines SL.

In the embodiment illustrated in FIG. 10, the panel driving circuit PDC drives the display panel 100 at 60 Hz. In other words, the panel driving circuit PDC may drive the display panel 100, such that an image is displayed on the display panel 100 in each of the image frames F1 to F60 for 1 second (s). In other words, the frequency of the synchronization signal FLM may be 60 Hz.

The sensor controller SCC may control the input sensor 200 to operate in the first sensing mode and/or the second sensing mode in each of the image frames F1 to F60.

The first sensing mode includes first sensing periods T1 to T143. The second sensing mode includes second sensing periods P1 to P59. In other words, the sensor controller SCC may drive the input sensor 200 at 143 Hz in the first sensing mode, and may drive the input sensor 200 at 59 Hz in the second sensing mode. The number of first sensing periods T1 to T143 and the number of second sensing periods P1 to P59, which are illustrated in FIG. 10, are provided only as examples, and thus, the present disclosure is not limited thereto.

In an embodiment, the transmit signals may be provided to the first sensing electrodes SA1 to SA14 (e.g., see FIG. 7) in each of the first sensing periods T1 to T143. Each of the first sensing periods T1 to T143 may include a time period during which sensing signals are received from the second sensing electrodes SB1 to SB10.

The uplink signals may be provided to the first sensing electrodes SA1 to SA14 and the second sensing electrodes SB1 to SB10 in each of the second sensing periods P1 to P59. Each of the second sensing periods P1 to P59 may include a time period during which the downlink signals are received from the first sensing electrodes SA1 to SA14 and the second sensing electrodes SB1 to SB10.

Each of the first sensing periods T1 to T143 is shorter than each of the image frames F1 to F60. Each of the first sensing periods T1 to T143 is longer than each of the second sensing periods P1 to P59.

In the example shown in FIG. 10, the sensor controller SCC performs a sensing operation during the first sensing periods T1, T2, and T3, and then operates during the second sensing period P1. Furthermore, the sensor controller SCC operates during the first sensing periods T4, T5, and T6 after the second sensing period P1, and then operates during the second sensing period P2. As such, the first sensing periods T1 to T143 are sequential in time, but are not necessarily continuous. The second sensing periods P1 to P59 are sequential in time, but are not necessarily continuous.

The first sensing mode may be a mode in which the first input IP1 by the first input means 1000 is sensed. The second sensing mode may be a mode in which the second input by the second input means 2000 is sensed.

In the example illustrated in FIG. 10, each of image frames F1 to F60 may correspond to at least two sensing periods. For example, the image frame F1 corresponds to the three first sensing periods T1, T2, and T3. The image frame F2 corresponds to the second sensing period P1 and the three first sensing periods T4, T5, and T6. A part of the first sensing period T6 corresponds to the image frame F2. Another part of the first sensing period T6 corresponds to the image frame F3.

When the synchronization signal FLM is activated to be a first level (e.g., a high level), the flag register FG (e.g., see FIG. 3) of the sensor controller SCC stores a flag bit set to a first value (e.g., '1').

When the synchronization signal FLM is activated to the first level (e.g., the high level), or in other words, when the flag register FG is changed to the first value, the sensor controller SCC changes an operating mode while operating in the first sensing mode to the second sensing mode.

In an embodiment, when the synchronization signal FLM is activated to the first level (e.g., the high level) during the first sensing period T3 while in the first sensing mode, the sensor controller SCC changes the operating mode to the second sensing mode, and operates during the second sensing period P1 in the second sensing mode. The sensor controller SCC changes the flag bit of the flag register FG to a second value (e.g., '0') to operate in the first sensing mode. When the second sensing period P1 is completed, the sensor controller SCC changes the operating mode to the first sensing mode, and operates during the first sensing period T4 in the first sensing mode.

When the synchronization signal FLM is not activated to the first level (e.g., the high level), or in other words, while the flag register FG is maintained at the second value, the sensor controller SCC operates in the first sensing mode while a sensing period is changed to the first sensing period T4 as time goes on.

When the synchronization signal FLM is activated to the first level (e.g., the high level) during the first sensing period T6 in the first sensing mode, the sensor controller SCC changes the operating mode to the second sensing mode, and operates during the second sensing period P2 in the second sensing mode. The sensor controller SCC changes the flag bit of the flag register FG to the second value (e.g., '0'). When the second sensing period P2 is completed, the sensor controller SCC changes the operating mode to the first sensing mode, and operates during the first sensing period T7 in the first sensing mode.

As illustrated in FIG. 10, even though the synchronization signal FLM is activated to the first level (e.g., the high level)

while the sensor controller SCC is operating during the first sensing period T6 in the first sensing mode, the sensor controller SCC does not stop the first sensing period T6, but changes the operating mode to the second sensing mode after the first sensing period T6 is completed.

While the synchronization signal FLM is maintained at the second level (e.g., the low level), the sensor controller SCC operates in the first sensing mode. The sensor controller SCC sequentially performs first sensing periods T1 to T143 in the first sensing mode while the synchronization signal FLM is maintained at the second level.

When the synchronization signal FLM is activated to the first level (e.g., the high level) during a k-th (where 'k' is a natural number) first sensing period Tk in the first sensing mode, the sensor controller SCC may complete the k-th first sensing period Tk, and then may change the sensing mode to the second sensing mode.

The sensor controller SCC operates during a single second sensing period in the second sensing mode, and then changes the operating mode back to the first sensing mode.

When the synchronization signal FLM is activated to the first level (e.g., the high level), the sensor controller SCC may operate in the second mode, and thus, may operate in the second sensing mode in each of the image frames F2 to F60.

The first sensing periods T1 to T143 in the first sensing mode and the second sensing periods P1 to P59 in the second sensing mode, which are illustrated in FIG. 10, are provided only as examples. The sensor controller SCC may variously modify the order of operations in the first sensing mode and the second sensing mode.

Figure 11:
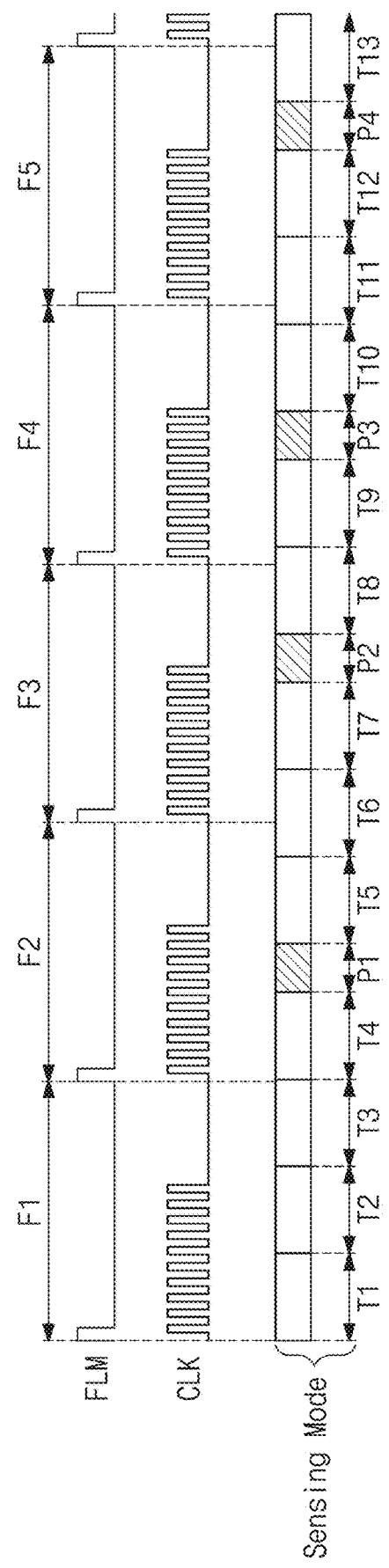
FIG. 11 is a timing diagram illustrating operations of an input sensor and a sensor controller according to an embodiment of the present disclosure.

FIG. 11 is a timing diagram illustrating operations of the input sensor 200 and the sensor controller SCC according to an embodiment of the present disclosure.

The synchronization signal FLM and the clock signal CLK, which are illustrated in FIG. 11, are the same or substantially the same as the synchronization signal FLM and the clock signal CLK described above with reference to FIG. 10, and thus, redundant description thereof may not be repeated.

In the embodiment shown in FIG. 11, when the synchronization signal FLM is activated to the first level (e.g., the high level), or in other words, when the flag register FG is changed to the first value, and while the sensor controller SCC operates in the first sensing mode, the sensor controller SCC performs the first sensing period in the first sensing mode once more, and then changes an operating mode to the second sensing mode.

In an embodiment, when the synchronization signal FLM is activated to the first level (e.g., the high level) during the first sensing period T3 in the first sensing mode, the sensor controller SCC performs the first sensing period T4 in the first sensing mode, and then changes the operating mode to the second sensing mode.

Similarly, when the synchronization signal FLM is activated to the first level (e.g., the high level) during the first sensing period T6 in the first sensing mode, the sensor controller SCC performs the first sensing period T7 in the first sensing mode, and then changes the operating mode to the second sensing mode.

Although not illustrated in FIG. 11, when the synchronization signal FLM is activated to the first level (e.g., the high level) during a k-th (where 'k' is a natural number) first sensing period Tk in the first sensing mode, the sensor controller SCC may complete the k-th first sensing period Tk, may change the sensing mode to the second sensing mode, and may continuously perform the second sensing period twice. In other words, each of the image frames F2 to F60 may correspond to two second sensing periods.

As such, the sensor controller SCC may variously modify the order of operations in the first sensing mode and the second sensing mode.

FIG. 12 is a flowchart illustrating an operation of a touch controller according to an embodiment of the present disclosure.

Referring to FIGS. 3, 10, and 12, the sensor controller SCC initially sets a sensing mode as the first sensing mode. In operation S100, the sensor controller SCC may sense the first input IP1 from the first input means 1000 during the first sensing mode.

The first sensing mode includes the first sensing periods T1 to T143. The sensor controller SCC sequentially performs the first sensing periods T1 to T143 in the first sensing mode.

When the synchronization signal FLM is transitioned to the first level (e.g., the high level) while the sensor controller SCC performs each of the first sensing periods T1 to T143, the sensor controller SCC sets the flag bit FLAG stored in the flag register FG to a first value (e.g., '1').

In operation S110, the sensor controller SCC determines whether the k-th first sensing period Tk from among the first sensing periods T1 to T143 is completed.

As described above, transmit signals may be provided to the first sensing electrodes SA1 to SA14 (e.g., see FIG. 7) in each of the first sensing periods T1 to T143. Each of the first sensing periods T1 to T143 may include a time period during which sensing signals are received from the second sensing electrodes SB1 to SB10.

In an embodiment, when a sensing signal is received from the second sensing electrode SB10 (e.g., see FIG. 7), the sensor controller SCC may determine that the k-th first sensing period Tk is completed.

When the last sensing operation has not yet been performed, the sensor controller SCC returns to operation S100, and operates in the first sensing mode. When it is determined that the last sensing operation is performed during the k-th first sensing period Tk, in operation S120, the sensor controller SCC determines whether the flag bit FLAG stored in the flag register FG is the first value (e.g., '1').

When the flag bit FLAG is not the first value (e.g., '1'), the sensor controller SCC maintains the sensing mode as the first sensing mode, and returns to operation S100 to perform the k+1th first sensing period 'Tk+1'.

When the flag bit FLAG is the first value (e.g., '1'), in operation S130, the sensor controller SCC changes the sensing mode as the second sensing mode.

In operation S140, the sensor controller SCC initializes the flag bit FLAG to a second value (e.g., '0'). In an embodiment, an operation in which the sensor controller SCC initializes the flag bit FLAG to the second value (e.g., '0') may be performed at the start of the first sensing mode. In an embodiment, an operation in which the sensor controller SCC initializes the flag bit FLAG to the second value (e.g., '0') may be performed before the sensing mode is changed to the second sensing mode.

FIG. 13 is a flowchart illustrating an operation of a touch controller according to an embodiment of the present disclosure.

Referring to FIGS. 3, 10, and 13, in operation S200, the sensor controller SCC may sense the second input IP2 from the second input means 2000 during the second sensing mode.

The second sensing mode includes the second sensing periods P1 to P59. The sensor controller SCC sequentially performs the second sensing periods P1 to P59 in the second sensing mode.

In operation S210, the sensor controller SCC determines whether a j-th (where 'j' is a natural number) second sensing period Pj from among the second sensing periods P1 to P59 is completed.

As described above, uplink signals may be provided to the first sensing electrodes SA1 to SA14 and the second sensing electrodes SB1 to SB10 in each of the second sensing periods P1 to P59. Each of the second sensing periods P1 to P59 may include a time period during which downlink signals are received from the first sensing electrodes SA1 to SA14 and the second sensing electrodes SB1 to SB10.

In an embodiment, when downlink signals are received from the second sensing electrodes SB1 to SB10 (e.g., see FIG. 7), the sensor controller SCC may determine that the j-th second sensing period Pj is completed.

When the j-th second sensing period Pj is completed, in operation S220, the sensor controller SCC changes a sensing mode to the first sensing mode.

FIGS. 14A to 14D are diagrams illustrating figures displayed on a display device by the first input IP1 using the first input means 1000.

Figure 14A:
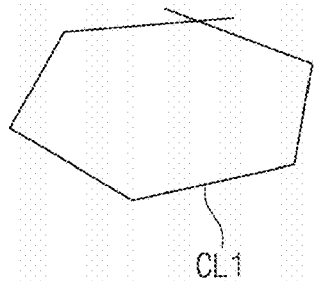
FIGS. 14A-14D are diagrams illustrating figures displayed on a display device by a first input using a first input means.

FIG. 14A illustrates a figure CL1 displayed on a display device by the first input IP1 using the first input means 1000, when the sensor controller SCC drives the input sensor 200 at 30 Hz in a first sensing mode.

Figure 14B:
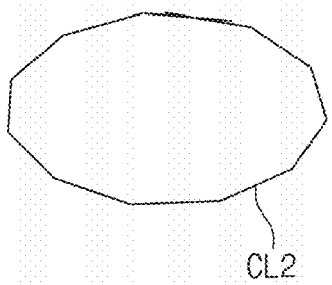

FIG. 14B illustrates a figure CL2 displayed on the display device by the first input IP1 using the first input means 1000, when the sensor controller SCC drives the input sensor 200 at 60 Hz in the first sensing mode.

Figure 14C:
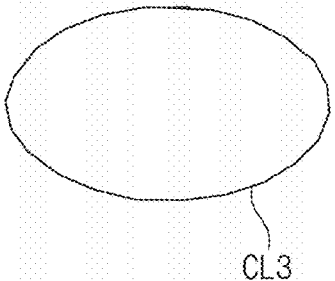

FIG. 14C illustrates a figure CL3 displayed on the display device by the first input IP1 using the first input means 1000, when the sensor controller SCC drives the input sensor 200 at 120 Hz in the first sensing mode.

Figure 14D:
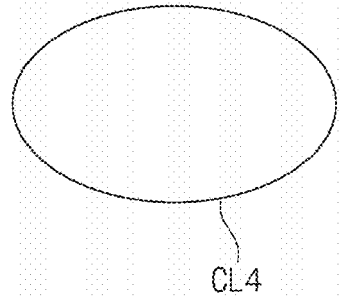

FIG. 14D illustrates a figure CL4 displayed on the display device by the first input IP1 using the first input means 1000, when the sensor controller SCC drives the input sensor 200 at 240 Hz in the first sensing mode.

As illustrated in FIGS. 14A to 14D, as a frequency at which the sensor controller SCC drives the input sensor 200 in the first sensing mode increases, a shape similar to a circle may be displayed.

In the example illustrated in FIG. 10, the panel driving circuit PDC may drive the display panel 100 at 60 Hz, and the sensor controller SCC may drive the input sensor 200 at 143 Hz in the first sensing mode. The sensitivity of each of the input sensor 200 and the sensor controller SCC may be improved by driving the input sensor 200 at a frequency higher than an operating frequency of the display panel 100.

Figure 15A:
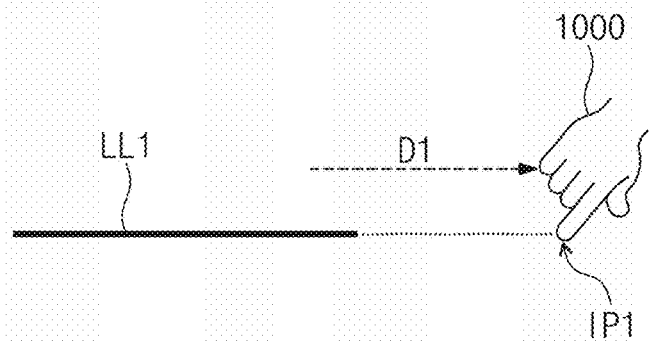
FIGS. 15A-15C are diagrams illustrating figures displayed on a display device by a first input using a first input means.
Figure 15B:
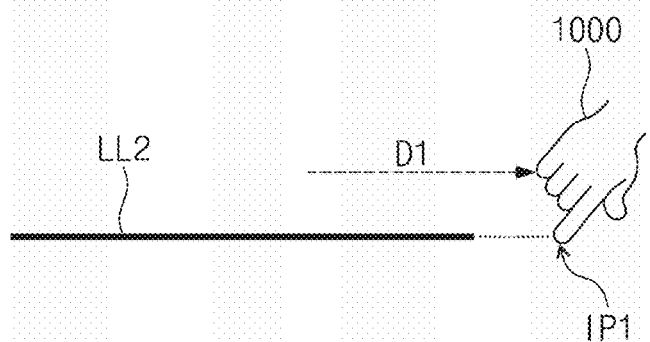
Figure 15C:
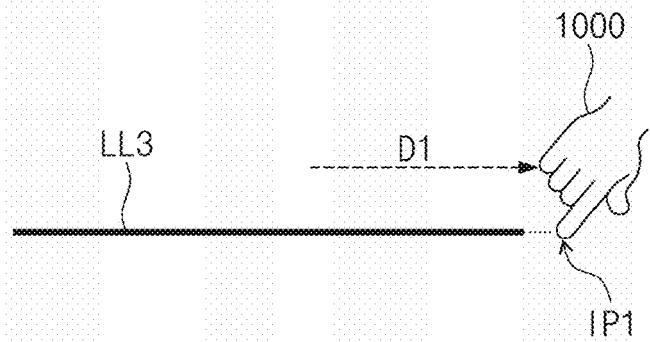

FIGS. 15A to 15C are diagrams illustrating figures displayed on a display device by the first input IP1 using the first input means 1000.

FIG. 15A illustrates a figure LL1 displayed on a display device by the first input IP1 using the first input means 1000, when the sensor controller SCC drives the input sensor 200 at 60 Hz in a first sensing mode.

FIG. 15B illustrates a figure LL2 displayed on the display device by the first input IP1 using the first input means 1000, when the sensor controller SCC drives the input sensor 200 at 120 Hz in the first sensing mode.

FIG. 15C illustrates a figure LL3 displayed on the display device by the first input IP1 using the first input means 1000, when the sensor controller SCC drives the input sensor 200 at 240 Hz in the first sensing mode.

As shown in FIGS. 15A to 15C, when the first input means 1000 provides the first input IP1 by moving in a direction (e.g., a predetermined direction) D1 at a suitable speed (e.g., a predetermined speed), a figure may be displayed at a speed similar to an input speed of the first input IP1, as a frequency at which the sensor controller SCC drives the input sensor 200 in the first sensing mode increases.

FIGS. 16A to 16D are diagrams illustrating figures displayed on a display device by the first input IP1 using the first input means 1000.

Figure 16A:
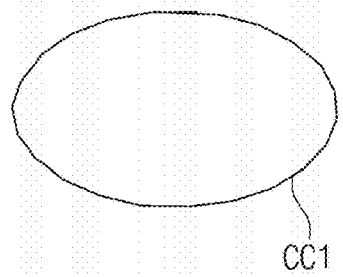
FIGS. 16A-16D are diagrams illustrating figures displayed on a display device by a first input using a first input means.
Figure 16B:
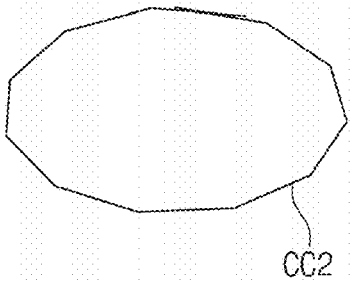
Figure 16C:
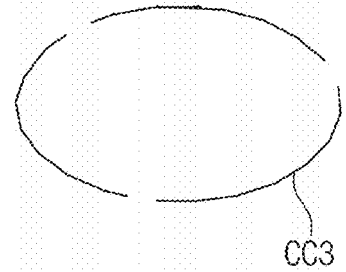

FIGS. 16A to 16C illustrate figures displayed on the display device by the first input IP1 using the first input means 1000 when the sensor controller SCC drives the input sensor 200 at the same or substantially the same frequency (e.g., 60 Hz) as that of the operation frequency of the display panel 100 in the first sensing mode.

FIG. 16A illustrates a figure CC1 displayed on the display device by the first input IP1 using the first input means 1000 in a normal environment.

FIGS. 16B and 16C illustrate figures CC2 and CC3 displayed on the display device by the first input IP1 using the first input means 1000 in a noisy environment, for example, in a case where there is moisture on a surface of the display device DD (e.g., refer to FIG. 1), in a case where there is a foreign object on the surface of the display device DD, or in a case where the coupling capacitance between circuit wires increases temporarily.

As illustrated in FIGS. 16B and 16C, in the noisy environment, a non-smooth line may be displayed as illustrated in the figure CC2 displayed on the display device by the first input IP1, or broken lines may be displayed as illustrated in the figure CC3 displayed on the display device by the first input IP1.

Figure 16D:
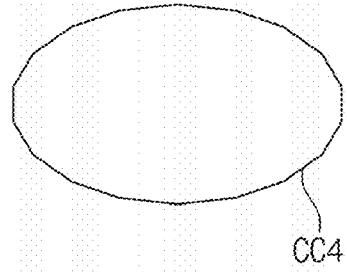

FIG. 16D illustrates a figure CC4 displayed on the display device by the first input IP1 using the first input means 1000 in the noisy environment, when the sensor controller SCC drives the input sensor 200 at 143 Hz in the first sensing mode.

When the sensor controller SCC drives the input sensor 200 at a high frequency in the first sensing mode, the figure CC4 displayed on the display device in the noisy environment may be displayed in a form similar to that in the normal environment as compared to the figures CC2 and CC3.

Figure 17A:
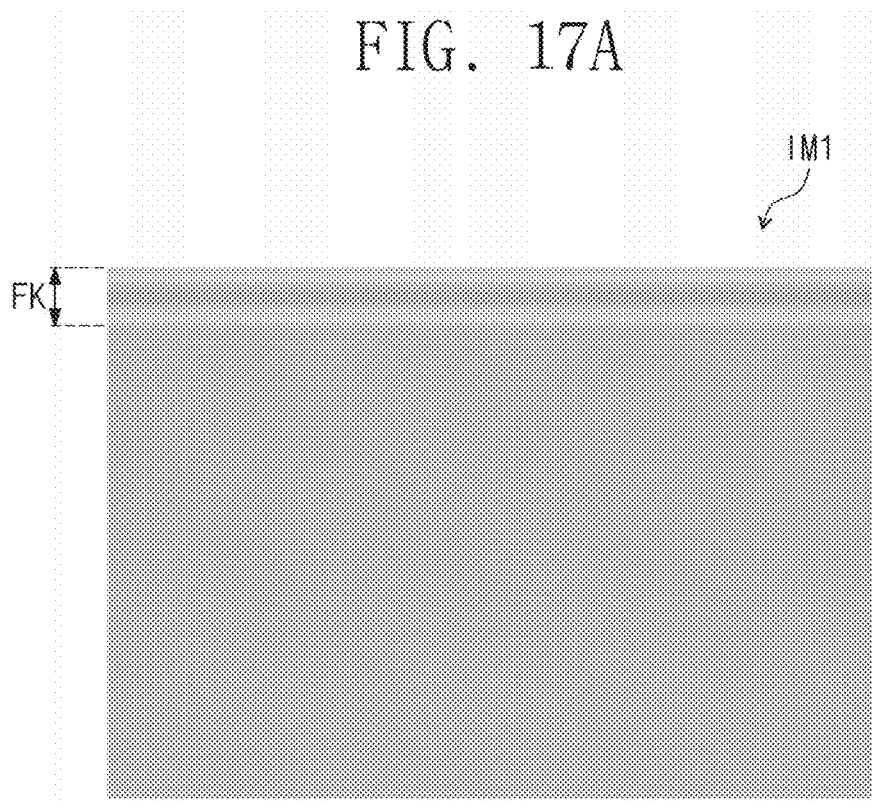
FIGS. 17A-17B illustrate images displayed on a display device.
Figure 17B:
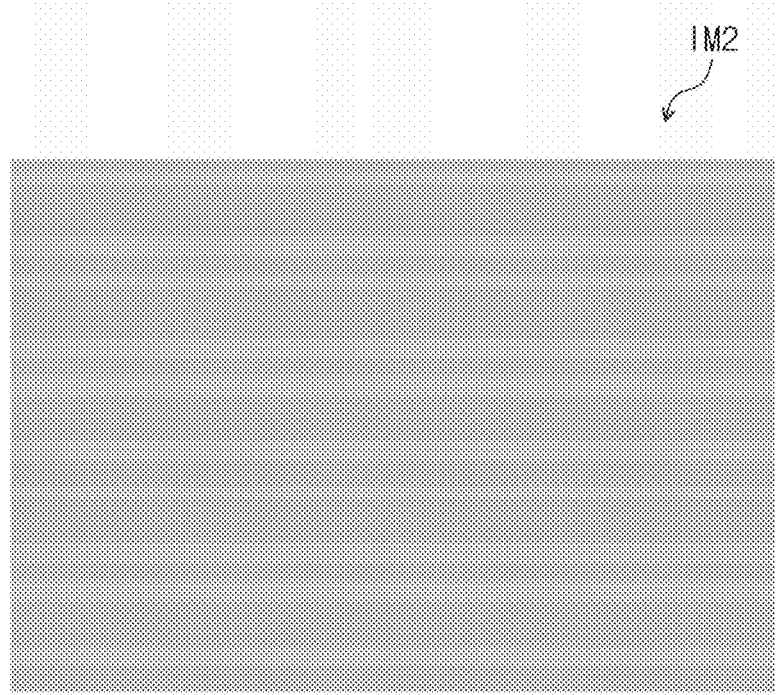

FIGS. 17A and 17B illustrate images displayed on a display device.

Referring to FIGS. 3 and 17A, the sensor controller SCC may operate in the second sensing mode at a suitable time (e.g., at a predetermined time) in synchronization with the synchronization signal FLM. In an embodiment, as soon as the synchronization signal FLM is changed to the first level, the sensor controller SCC may operate in the second sensing mode. In an embodiment, when a suitable time (e.g., a predetermined time) elapses after the synchronization signal FLM is changed to the first level, the sensor controller SCC may operate in the second sensing mode. In this case, a flicker may appear at a location (e.g., a specific location) FK of an image IM1 due to the coupling capacitance between signals provided to the display panel 100 and signals provided to the input sensor 200.

As illustrated in FIG. 10, the sensor controller SCC according to an embodiment of the present disclosure operates in the second sensing mode in synchronization with the synchronization signal FLM. Time points at which the second sensing periods in the second sensing mode are started may be different from one another for each of the image frames F1 to F60.

In this case, as illustrated in FIG. 17B, the influence of the coupling capacitance between signals provided to the display panel 100 and signals provided to the input sensor 200 may be distributed, and thus, a flicker may not appear in an image IM2.

According to one or more embodiments of the present disclosure described above, a sensor controller of a display device may sense not only a user's touch, but also an input from an electronic pen. The sensor controller may sense the user's touch and the input from the electronic pen in synchronization with a synchronization signal provided to a display panel, and may set (e.g., may change) a touch sensing frequency to a frequency higher than a video frequency. Accordingly, the sensitivity to the user's touch input may be improved. Further, time points of changing (e.g., switching) between touch sensing and pen sensing may be changed for each frame, and thus, flicker of an image may be reduced.

Although some example embodiments have been described, those skilled in the art will readily appreciate that various modifications are possible in the example embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific example embodiments disclosed herein, and that various modifications to the disclosed example embodiments, as well as other example embodiments, are intended to be included within the spirit and scope of the present disclosure as defined in the appended claims, and their equivalents.

What is claimed is:

1. A display device comprising:
a display panel;
an input sensor on the display panel;
a panel driving circuit configured to drive the display panel, and to output a synchronization signal, an active level of the synchronization signal indicating a start of an image frame; and
a sensor controller configured to control the input sensor,
wherein the sensor controller is configured to determine a sensing mode from among a first sensing mode and a second sensing mode in response to the synchronization signal having the active level, and to change the sensing mode to the second sensing mode when the synchronization signal is activated in the first sensing mode.

2. The display device of claim 1, wherein the first sensing mode comprises a plurality of first sensing periods.

3. The display device of claim 2, wherein, when the synchronization signal is activated during a k-th first sensing period from among the plurality of first sensing periods, where k is a natural number, the sensor controller is configured to complete the k-th first sensing period, and to change the sensing mode to the second sensing mode.

4. The display device of claim 3, wherein the second sensing mode comprises a plurality of second sensing periods.

5. The display device of claim 4, wherein each of the plurality of first sensing periods is longer in time than each of the plurality of second sensing periods.

6. The display device of claim 2, wherein the synchronization signal is a signal activated at a point in time when each of a plurality of image frames is started.

7. The display device of claim 6, wherein each of the plurality of first sensing periods is shorter in time than each of the plurality of image frames.

8. The display device of claim 2, wherein, when the synchronization signal is activated, the sensor controller is configured to set a flag bit to a first value.

9. The display device of claim 8, wherein, when the flag bit is the first value during a k-th first sensing period from among the plurality of first sensing periods, where k is a natural number, the sensor controller is configured to complete the k-th first sensing period, and to change the sensing mode to the second sensing mode.

10. The display device of claim 6, wherein the display panel comprises:
a plurality of pixels connected to a plurality of scan lines and a plurality of data lines; and
a scan driving circuit connected to the plurality of scan lines, and
wherein the scan driving circuit is configured to provide scan signals to the plurality of scan lines, respectively, in each of the plurality of image frames in synchronization with the synchronization signal.

11. The display device of claim 1, wherein the sensor controller is configured to sense a first input by a touch in the first sensing mode, and to sense a second input by an input device configured to output a downlink signal in the second sensing mode.

12. The display device of claim 11, wherein the sensor controller is configured to output an uplink signal to the input sensor in the second sensing mode, and to receive the downlink signal from the input sensor.

13. A display device comprising:
a display panel configured to display an image in each of a plurality of continuous image frames in synchronization with a synchronization signal, an active level of the synchronization signal indicating a start of an image frame from among the plurality of continuous image frames;
an input sensor comprising a first sensing electrode, and a second sensing electrode crossing the first sensing electrode and insulated from the first sensing electrode; and
a sensor controller configured to transmit and receive a signal with the first sensing electrode and the second sensing electrode,
wherein the sensor controller is configured to operate in each of the plurality of continuous image frames in a first sensing mode and a second sensing mode, and
wherein, when the synchronization signal is activated while the sensor controller operates during a first sensing period in the first sensing mode, the sensor controller is configured to change an operating mode to the second sensing mode after the first sensing period is completed.

14. The display device of claim 13, wherein the sensor controller is configured to provide a transmit signal to the first sensing electrode in the first sensing mode, and to receive a sensing signal from the second sensing electrode, and wherein the sensor controller is configured to provide an uplink signal to the first sensing electrode and the second sensing electrode in the second sensing mode, and to receive a downlink signal from the first sensing electrode and the second sensing electrode.

15. The display device of claim 13, wherein the first sensing period is shorter in time than each of the plurality of continuous image frames.

16. The display device of claim 13, wherein, when the synchronization signal is activated, the sensor controller is configured to set a flag bit to a first value.

17. The display device of claim 13, further comprising:
a panel driving circuit configured to drive the display panel, and to output the synchronization signal.

18. The display device of claim 13, wherein the sensor controller is configured to sense a first input by a touch in the first sensing mode, and to sense a second input by an input device configured to output a downlink signal in the second sensing mode.

19. An operating method of a display device comprising a display panel, and an input sensor configured to operate in a first sensing mode and a second sensing mode, the method comprising:

sensing a first input from the input sensor during a first sensing period of the first sensing mode;

determining whether the first sensing period is completed;

determining whether a flag signal indicating a state of a synchronization signal is a first value, an active level of the synchronization signal indicating a start of an image frame; and in response to determining that the first sensing period is completed and the flag signal is the first value, changing an operating mode to the second sensing mode during which a second input is sensed from the input sensor.

20. The method of claim 19, further comprising displaying an image on the display panel during each of a plurality of continuous image frames in synchronization with the synchronization signal.

* * * * *

UNITED STATES PATENT AND TRADEMARK OFFICE
CERTIFICATE OF CORRECTION

PATENT NO. : 11,637,155 B2
APPLICATION NO. : 17/341139
DATED : April 25, 2023
INVENTOR(S) : Gyeong-Ub Moon et al.

It is certified that error appears in the above-identified patent and that said Letters Patent is hereby corrected as shown below:

On the Title Page
Column 1, item (72) Inventors, Line 2    Delete "Chui" and
Insert -- Chul --

Signed and Sealed this
Fourth Day of July, 2023

Katherine Kelly Vidal
*Director of the United States Patent and Trademark Office*